US010067164B2

(12) United States Patent
DeBauche et al.

(10) Patent No.: US 10,067,164 B2
(45) Date of Patent: Sep. 4, 2018

(54) TESTING APPARATUS AND METHOD FOR MICROCIRCUIT TESTING WITH CONICAL BIAS PAD AND CONDUCTIVE TEST PIN RINGS

(71) Applicant: Johnstech International Corporation, Minneapolis, MN (US)

(72) Inventors: John DeBauche, White Bear Township, MN (US); Dan Campion, Chanhassen, MN (US); Michael Andres, Inver Grove Heights, MN (US); Steve Rott, St. Cloud, MN (US); Jeffrey Sherry, Savage, MN (US); Brian Halvorson, St. Paul, MN (US); Brian Eshult, St. Paul, MN (US)

(73) Assignee: Johnstech International Corporation, Minneapolis, MN (US)

( * ) Notice: Subject to any disclaimer, the term of this patent is extended or adjusted under 35 U.S.C. 154(b) by 234 days.

(21) Appl. No.: 15/245,899

(22) Filed: Aug. 24, 2016

(65) Prior Publication Data
US 2017/0059616 A1    Mar. 2, 2017

Related U.S. Application Data

(60) Provisional application No. 62/209,164, filed on Aug. 24, 2015.

(51) Int. Cl.
*G01R 1/067* (2006.01)
*G01R 31/00* (2006.01)
(Continued)

(52) U.S. Cl.
CPC ..... *G01R 1/07371* (2013.01); *G01R 1/07314* (2013.01); *G01R 31/2851* (2013.01)

(58) Field of Classification Search
CPC ............ G01R 1/07371; G01R 31/2851; G01R 1/07314
(Continued)

(56) References Cited

U.S. PATENT DOCUMENTS

| 5,066,907 A | 11/1991 | Tarzwell et al. |
| 5,385,477 A | 1/1995 | Vaynkof et al. |

(Continued)

FOREIGN PATENT DOCUMENTS

| CN | 101957389 | 1/2011 |
| FR | 2511197 | 2/1983 |

(Continued)

OTHER PUBLICATIONS

Extended European Search Report for European patent application No. 14823081.6 dated Jul. 17, 2017.

(Continued)

*Primary Examiner* — Farhana Hoque
(74) *Attorney, Agent, or Firm* — Altera Law Group, LLC

(57) ABSTRACT

The test system provides an array of test probes. The probes pass through a first or upper probe guide retainer which has a plurality of slot sized to receive the probes in a way that they cannot rotate. A plurality of flex circuits at the different heights engage bottom probe ends at their respective height levels and flex circuits continue the electrical connection from the probes to a load board. The test probes are bonded to the flex circuits by ring shaped flowable conductive material. The flex circuits are biased against a load board by an elastomeric pad of spaced part conical projections.

16 Claims, 55 Drawing Sheets

(51) Int. Cl.
  *G01R 1/073* (2006.01)
  *G01R 31/28* (2006.01)
(58) Field of Classification Search
  USPC .................. 324/750.25, 755.09, 755.16
  See application file for complete search history.

(56) References Cited

U.S. PATENT DOCUMENTS

| | | |
|---|---|---|
| 9,696,347 B2 | 7/2017 | DeBauche et al. |
| 2002/0011853 A1 | 1/2002 | Noda |
| 2003/0192181 A1 | 10/2003 | Fjelstad et al. |
| 2004/0124862 A1 | 7/2004 | Sugawara |
| 2007/0212900 A1 | 9/2007 | Crippen |
| 2009/0058440 A1 | 3/2009 | Miura |
| 2009/0167334 A1 | 7/2009 | Fjelstad |
| 2011/0062980 A1 | 3/2011 | Wu |
| 2011/0138617 A1 | 6/2011 | Clayton et al. |
| 2012/0062261 A1* | 3/2012 | Nelson ............ G01R 1/06738 324/755.09 |
| 2012/0319711 A1 | 12/2012 | Hung et al. |
| 2013/0002285 A1 | 1/2013 | Nelson et al. |
| 2013/0342233 A1 | 12/2013 | Edwards |

FOREIGN PATENT DOCUMENTS

| | | |
|---|---|---|
| JP | 2010091349 | 4/2010 |
| JP | 5156973 | 3/2013 |

OTHER PUBLICATIONS

International Search Report for PCT International Application No. PCT/US14/46249 dated Dec. 17, 2014.

\* cited by examiner

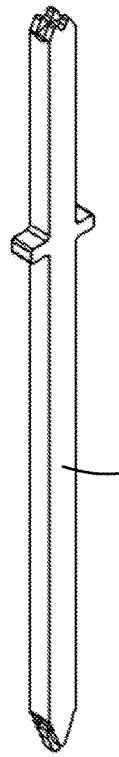
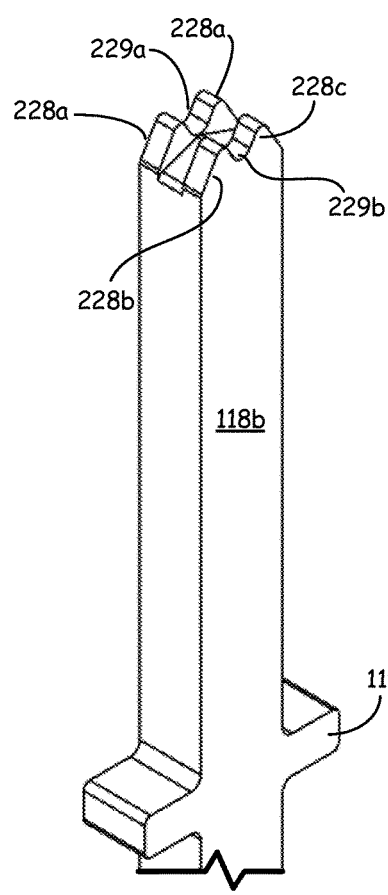
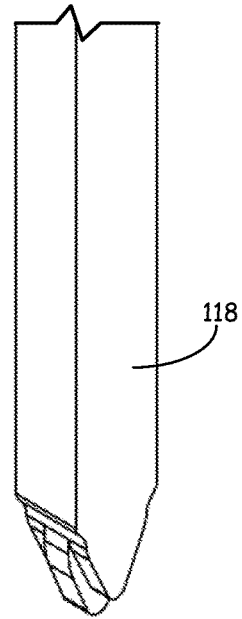
FIG. 20A
FIG. 20B
FIG. 20C

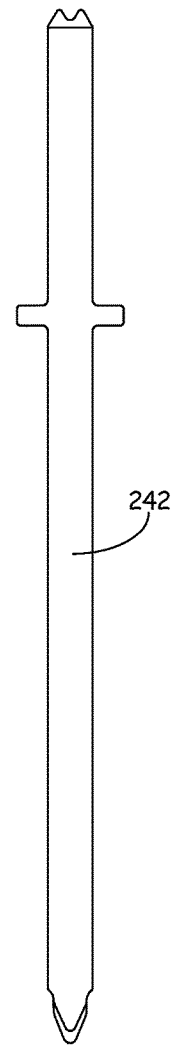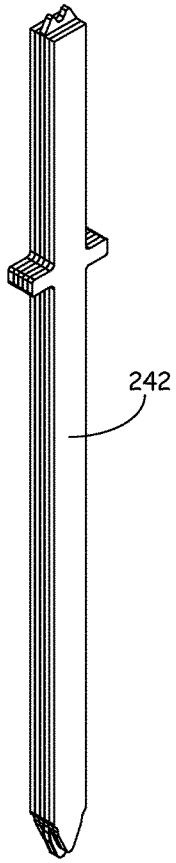
FIG. 22C   FIG. 22D   FIG. 22E   FIG. 22F
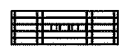
FIG. 22G   FIG. 22H

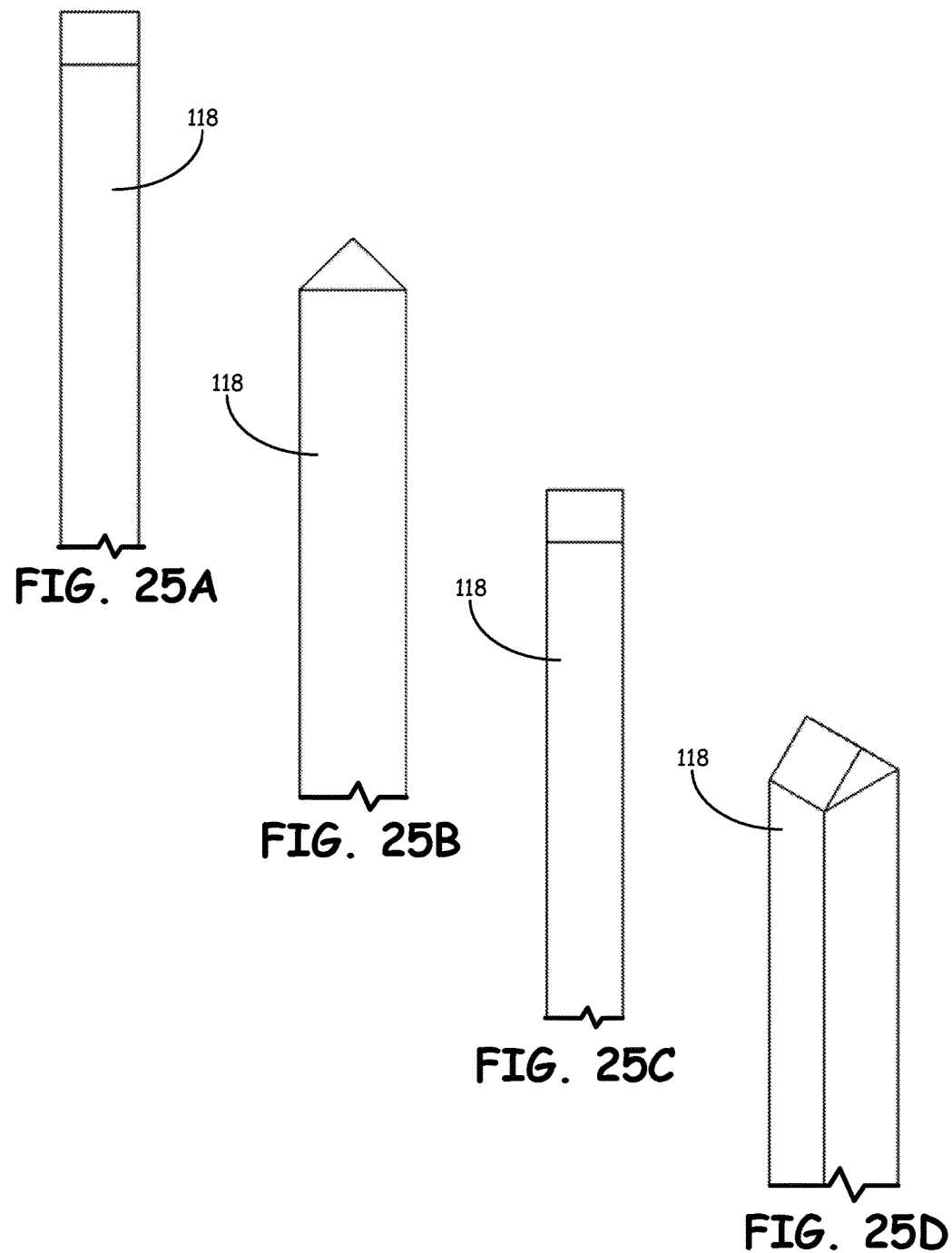

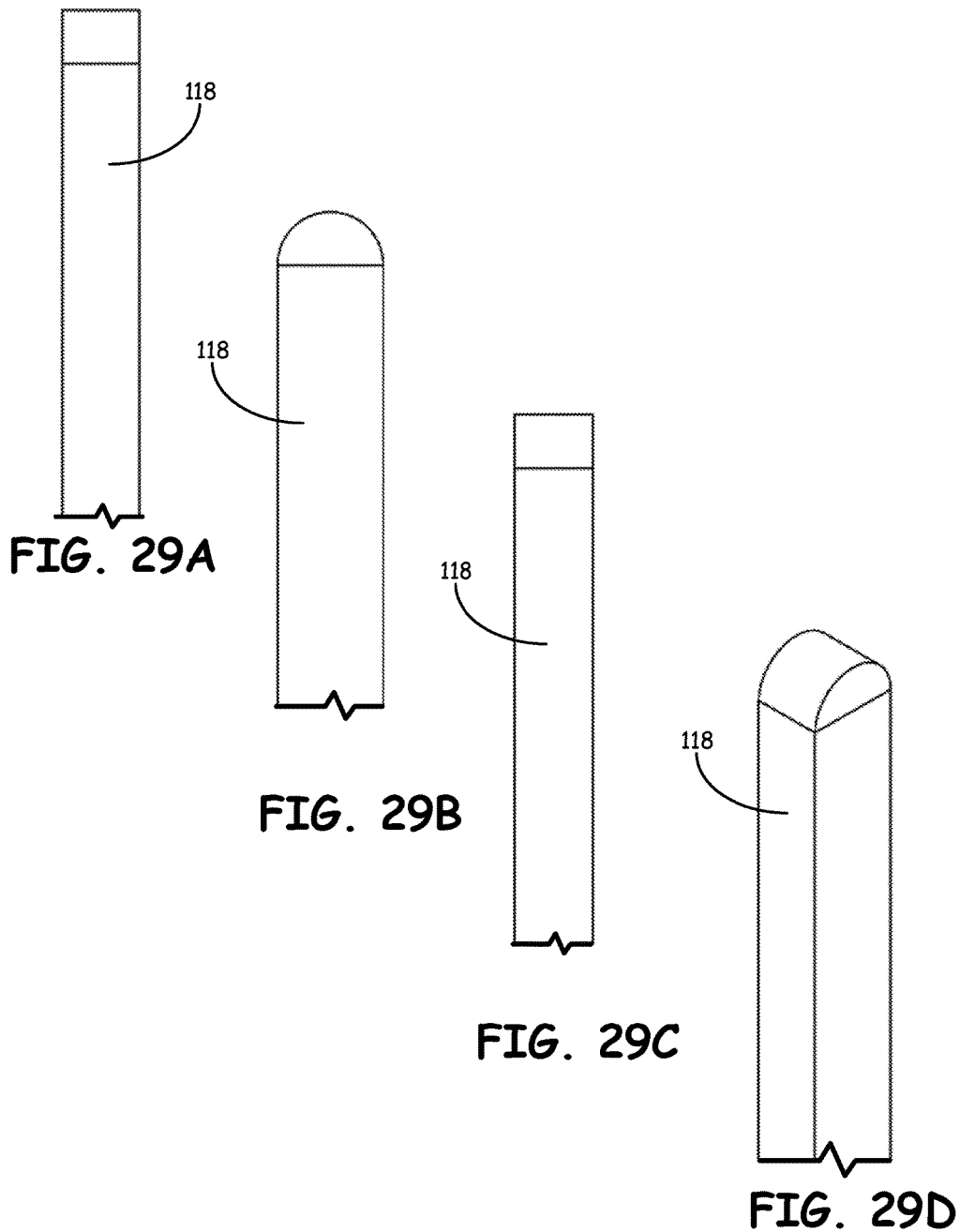

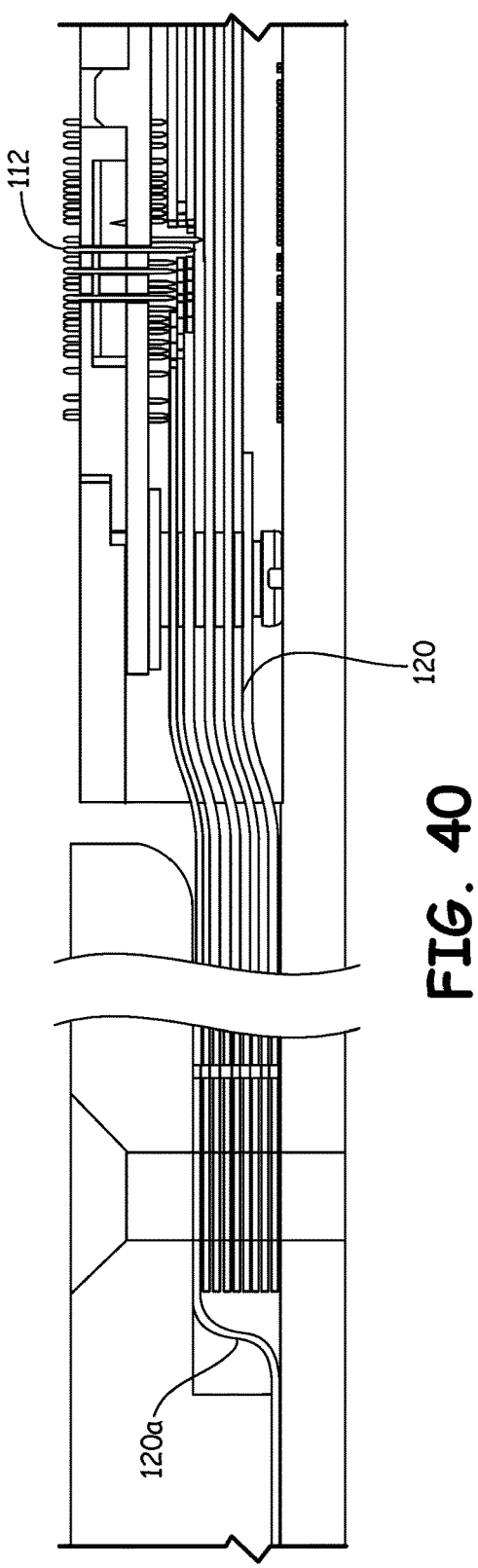

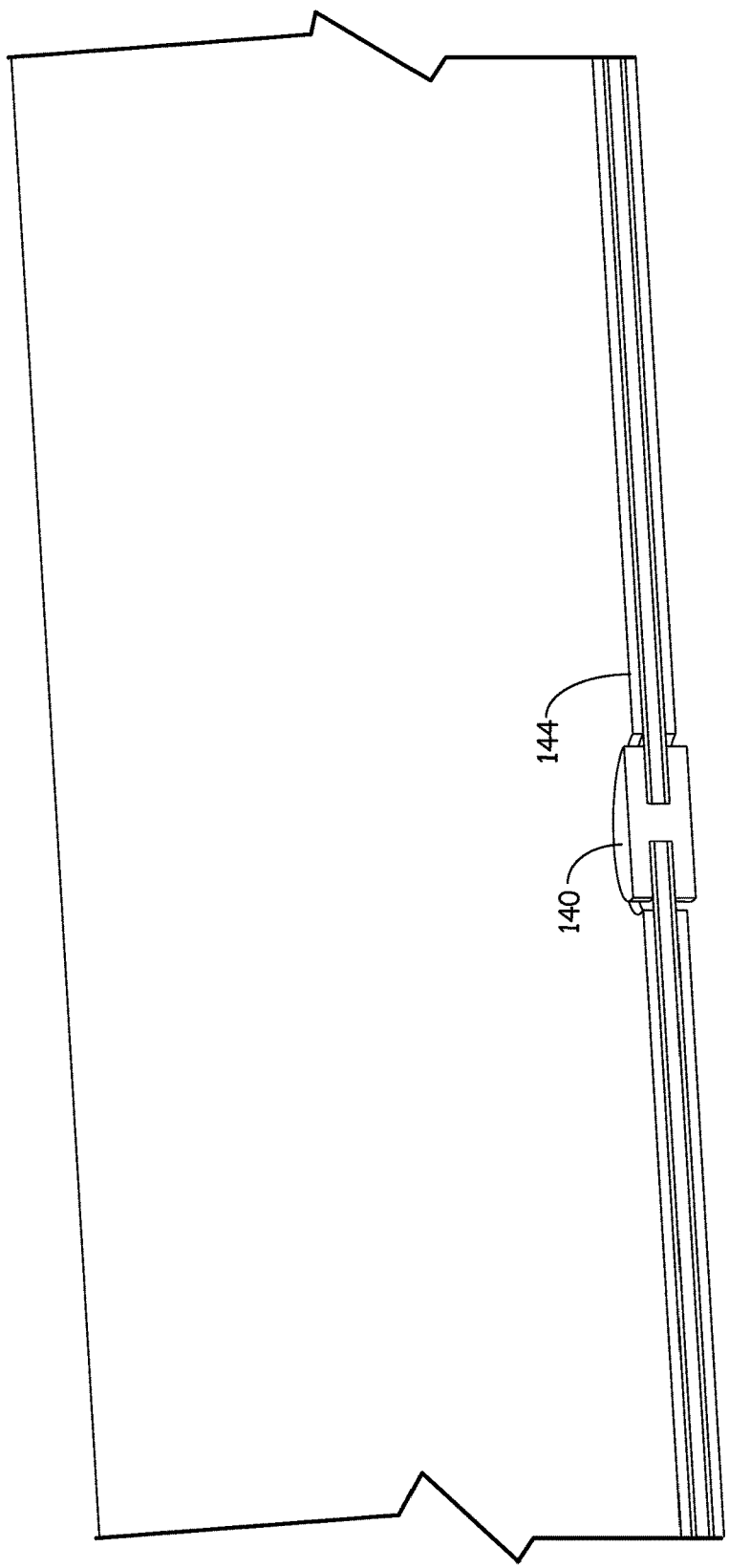

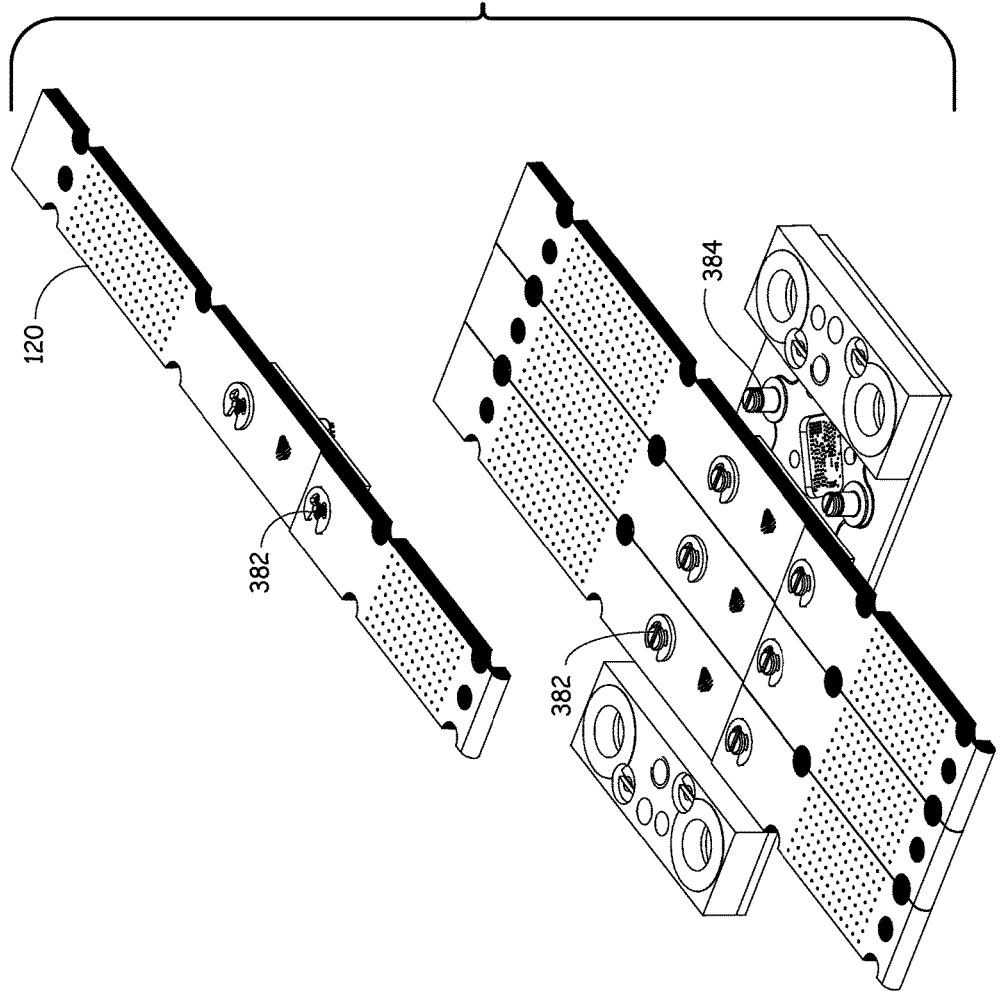

TESTING APPARATUS AND METHOD FOR MICROCIRCUIT TESTING WITH CONICAL BIAS PAD AND CONDUCTIVE TEST PIN RINGS

BACKGROUND OF THE INVENTION

Technical Field

The present invention is directed to equipment for testing microcircuits.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit probes. Because of the small size of microcircuit probes and the spacing between them, even small errors in making the probe will result in incorrect connections. Connections to the microcircuit that are misaligned or otherwise incorrect will cause the test equipment to identify the die under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester pins making electrical connections to the microcircuit terminals during testing. This wear dislodges conductive debris from both the tester pins and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester pins that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test probes that mimic the pattern of the microcircuit terminal array. The array of test probes is supported in a structure that precisely maintains the alignment of the probes relative to each other. A retainer and probe guide align the microcircuit itself with the test probes. The test probes, probe guide, and retainer are mounted on a probe card having conductive pads that make electrical connection to the test probes. The probe card pads are connected to circuit paths that carry the signals and power between the test equipment electronics and the test probes.

For the electrical tests, it is desired to form a temporary electrical connection between each terminal on the die under test and a corresponding electrical pad on a probe card. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the die under test and the electrical pads on the probe card. When the die under test is forced into contact with the tester, the probes complete the circuits between respective die under test probes and corresponding probe card pads. After testing, when the die under test is released, the terminals separate from the probes and the circuits are broken.

The present application is directed to improvements to a probe array system capable of high performance testing for die with fine pitch.

There is a type of testing known as "Kelvin" testing, which measures the resistance between two terminals on the die under test. Basically, Kelvin testing involves forcing a current to flow between the two terminals, measuring the voltage difference between the two terminals, and using Ohm's Law to derive the resistance between the terminals, given as the voltage divided by the current. Each terminal on the die under test is electrically connected to two contact pads on the probe card. One of the two pads supplies a known current amount of current. The other pad is a high-impedance connection that acts as a voltmeter, which does not draw any significant amount of current. In other words, each terminal on the die under test that is to undergo Kelvin testing is simultaneously electrically connected to two pads on the probe card—one pad supplying a known amount of current and the other pad measuring a voltage and drawing an insignificant amount of current while doing so. The terminals are Kelvin tested two at a time, so that a single resistance measurement uses two terminals on the probe card and four contact pads.

In this application, the pins that form the temporary electrical connections between the die under test and the probe card may be used in several manners. In a "standard" test, each pin connects a particular terminal on the die under test to a particular pad on the probe card, with the terminals and pads being in a one-to-one relationship. For these standard tests, each terminal corresponds to exactly one pad, and each pad corresponds to exactly one terminal. In a "Kelvin" test, there are two pins contacting each terminal on the die under test, as described above. For these Kelvin tests, each terminal (on the die under test) corresponds to two pads (on the probe card), and each pad (on the probe card) corresponds to exactly one terminal (on the die under test). Although the testing scheme may vary, the mechanical structure and use of the probes is essentially the same, regardless of the testing scheme.

There are many aspects of the test beds that may be incorporated from older or existing test beds. For instance, much of the mechanical infrastructure and electrical circuitry may be used from existing test systems, and may be compatible with the electrically conductive probes disclosed herein. Such existing systems are listed and summarized below.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer projects a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.1 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test probe arrangement has short signal paths.

Third, solders commonly in use today for BGA terminals are mainly tin for environmental purposes. Tin-based solder alloys are likely to develop an oxide film on the outer surface that conducts poorly. Older solder alloys include substantial amounts of lead, which do not form oxide films. The test probes must be able to penetrate the oxide film present.

BGA test contacts currently known and used in the art employ spring pins made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contacts. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

BRIEF SUMMARY

The following summary is intended to assist the reader in understanding some of the basic concepts of the present disclosure but not intended to limit the scope of the invention.

Amongst other concepts the following is disclosed. A test system for testing integrated circuits (IC) comprising any or all of the following elements:

a. an upper probe guide plate having an array of spaced apart upper apertures for receiving a test probe;

b. a lower probe guide plate having a like array of spaced apart lower apertures, collinearly aligned with the apertures of said upper guide, or receiving a test probe;

c. an elastomeric block have a like a like array of spaced apart apertures, collinearly aligned with the passages of said upper guide, for receiving a test probe;

d. a plurality of elongated test probes having a probe tip at its distal end and a connecting end at its proximal end, and a cross member extending generally orthogonally from each of said probes, said cross member being of such extent that it cannot pass through said upper apertures or said passages in said elastomeric material;

e. said test probes passing through said upper and lower apertures and said passages, with said cross member located between said upper probe guide plate and said elastomer, so that the bias force of the elastomer drives said probes upwardly thorough said upper plate to a stop where said cross member engages said upper plate;

f. said proximal ends of said test probes being group into a plurality of subgroups, each of the ends in said subgroup having the same height as measured from the lower probe guide relative to other ends in that subgroup and wherein the proximal ends in each of the subgroups having different heights relative to other subgroups;

g. said subgroups being arranged with into a pattern with the tallest probes being grouped together in a central region, and successively shorter subgroups being groups around the periphery of the adjacent taller probes; to thereby form a staggered presentation of probes with the tallest in the central region and descending therefrom;

h. a plurality of layers flex circuits having a plurality of connection points for engaging the proximal ends of said test probes, said flex circuits being laterally spaced apart in planes corresponding to the heights of the subgroups, so that one flex circuit corresponds to each subgroup, i. a first of said flex circuits being configured to have its connection points engaging said tallest probes in said central region and successive flex circuits having their connection points engaging the next successive subgroup of next tallest probes with an aperture in said flex circuit corresponding to the space occupied by prior taller probe subgroups, so that successive flex circuits have progressively larger apertures than the prior flex circuit.

Also disclosed is a method of connecting making electrical connections to ends of a matrix of electrical test probes in a testing system for testing integrated circuits, comprising any or all the steps in any order of:

a. adapting the length of the probes in the matrix into subgroups of differing heights, wherein the first subgroup contains at least the tallest probes and wherein the second and successive subgroups contains probes progressively shorter than the adjacent subgroup and wherein the probes of the successive subgroups contain probes which surround the adjacent taller subgroup, so that the probes together for a staggered structure with the tallest probes in a central region;

b. providing a plurality of stacked circuit boards corresponding to the number of subgroups, each board having connectors configured to reach a respective set of subgroup probes; wherein the first of said boards being on the bottom of the stack and the next successive boards being placed atop said board and wherein each successive board includes an aperture in the central region sufficient to allow taller probes to pass therethrough without engaging that board; so that the tallest probes will engage the bottom board and shorter probes will engage successive boards.

Also disclosed is a method of testing integrated circuits (IC) with a matrix of probes having a top and bottom end, said probes corresponding in position to test pads on the IC, the method of any or all of the following steps in any order, comprising:
  a. forming an upper probe guide plate with a plurality of slots to receive the top end said probes;
  b. forming a bottom guide plate with a plurality of slots to receive the bottom end of said probes;
  c. forming a portion on said probes between said ends with an increased cross sectional diameter; said diameter being larger than said slot on said upper plate, and thereby forming an upstop;
  d. forming an elastomeric block around probes between said upper and lower plates, and below said upstop;
so that, said elastomer will drive said increased diameter toward said upper plate thereby providing a bias force on said probes toward said IC.

Also disclosed is test system for testing integrated circuits (IC) comprising:
  a. an upper probe guide plate having an array of spaced apart upper apertures for receiving a test probe;
  b. an anti-intrusion layer proximate said upper probe guide plate, said layer having a like array of spaced apart lower apertures, collinearly aligned with the apertures of said upper guide, or receiving a test probe;
  c. an elastomeric block have a like a like array of spaced apart apertures, collinearly aligned with the passages of said upper guide, for receiving a test probe;
  d. a plurality of elongated test probes having a probe tip at its distal end and a connecting end at its proximal end, and a cross member extending generally orthogonally from each of said probes, said cross member being of such extent that it cannot pass through said upper apertures or said passages in said elastomeric material;
  e. said test probes passing through said upper and lower apertures and said passages, with said cross member located between said upper probe guide plate and said anti-intrusion later, so that the bias force of the elastomer drives said probes upwardly thorough said upper plate to a stop where said cross member engages said upper plate;
  f. said proximal ends of said test probes being group into a plurality of subgroups, each of the ends in said subgroup having the same height as measured from the lower probe guide relative to cross member and wherein the proximal ends in each of the subgroups having different heights relative to other subgroups;
  g. a plurality of layers flex circuits having a plurality of connection points for receiving engaging the proximal ends of said test probes, said flex circuits being laterally spaced apart in planes:
  h. a first set of said circuits having arms each with an aperture for receiving proximal ends of a test probe;
  i. a solid conductive flowable element located on at least some of said arms and having an aperture, the element aperture being concentric with the aperture of said arm, so that a portion of the proximal ends of said test probes can protrude through said apertures.

Also disclosed is a system wherein said flowable element is a donut shaped ring sized to surround said arm aperture, said element includes flowable metal capable of flowing onto said proximal end of said test probe thereby making an electrical connection between said test probe and arm.

Also disclosed is a system wherein said flowable element includes a flowable solder paste formed into a ring structure.

Also disclosed is a system wherein said flowable element includes materials which become liquid and flowable at a predetermined temperature above standard room temperature and solid at room temperature.

The system wherein at least some of said arms include a flow barrier portion applied spaced from said aperture, said flow barrier configured to block the flow of flowable conductive material from flowing beyond a fixed point on said arm.

Also disclosed is a system wherein said barrier includes a non-conductive material bonded to said arm to provide a physical barrier to flowable material.

Also disclosed is a system wherein said barrier has a distal end proximate said aperture which is concave.

Also disclosed is a system for testing integrated circuits (IC) comprising:
  a. a plurality of elongated test probes having a probe tip at its distal end and a connecting end at its proximal end,
  b. a plurality of layers flex circuits having a plurality of connection points for receiving the proximal ends of said test probes, said flex circuits being laterally spaced apart;
  c. a first set of said flex circuits having arms each with an aperture for receiving proximal ends of a test probe at one end and termination points at another end; said other end having a first face for electrical contact with a load board and second back opposite said first face;
  d. a compression pad including a plurality of adjacent conical elastomeric projections applied to said opposite face with said projections engaging said opposite face to apply bias pressure on said other end of said flex circuit to maintain resilient electrical contact between the load board and said flex circuit.

Also disclosed is a system wherein said conical projections include a plurality of closely spaced tapered projections.

Also disclosed is a method of applying force between a flex circuit and a load board in an integrated circuit testing device, the flex circuit having a contact face having electrical contact points, and an opposite face, the contact face being located adjacent the load board having like electrical contact points, comprising the steps of:
  a. forming a pad of closely spaced resilient conical projections;
  b. locating said pad adjacent said opposite face, with said projections in engagement with said opposite face,
  c. applying pressure on said pad to compress said projections into said opposite face,
  d. thereby maintaining said electrical contact points resiliently biased toward each other.

Also disclosed is a method of connecting probe bottom ends to a flex circuit having probe apertures, in the testing integrated circuits (IC) with a matrix of probes having a top and bottom end, said probes corresponding in position to test pads on the IC, the method comprising:
   a. inserting the probe bottom ends into apertures in the flex circuit;
   b. inserting a ring of flowable conductive material against said apertures and concentric therewith;
   c. heating the flowable materials to cause it to flow between the ends and the flex circuit.

A method of applying force between a flex circuit and a load board in an integrated circuit testing device, the flex circuit having a contact face having electrical contact points, and an opposite face, the contact face being located adjacent the load board having like electrical contact points, comprising the steps of:
   a. forming a pad of closely spaced resilient conical projections;
   b. locating said pad adjacent said opposite face, with said projections in engagement with said opposite face;
   c. applying pressure on said pad to compress said projections into said opposite face;
   d. thereby maintaining said electrical contact points resiliently biased toward each other.

Also disclosed is a method of connecting probe bottom ends to a flex circuit having probe apertures, in the testing integrated circuits (IC) with a matrix of probes having a top and bottom end, said probes corresponding in position to test pads on the IC, the method comprising any or all of the following steps in any order:
   a. inserting the probe bottom ends into apertures in the flex circuit;
   b. inserting a ring of flowable conductive material against said apertures and concentric therewith
   c. heating the flowable materials to cause it to flow between the ends and the flex circuit.

Also disclosed is a method applying the ring to the flex circuit before insertion of the said bottom ends.

Also disclosed is a method including applying the ring to the flex circuit before insertion of the said bottom ends.

BRIEF DESCRIPTION OF THE SEVERAL VIEWS OF THE DRAWINGS

FIG. 13 is a side perspective view with portion broken away of a pin array of a second embodiment.

FIGS. 20A-C are side perspective views of parts of pins, 20A being a pin tip showing a full pin, 20B is a partial perspective view, and tip 20C is a partial side perspective view of the bottom portion.

FIGS. 25A-D are partial views of a pyramid style pin tip in side, front, other side plan view, and a perspective view.

FIGS. 29A-D are partial views of a dome style pin tip in side, front, other side plan view, and a perspective view.

FIG. 33 is close up partial view of the subject matter in FIG. 32B.

FIG. 40 is a side plan view with portion of the housing and stacked flex circuits with the top layer folded under the bottom later to avoid changes in impedance causes by adjacent layers FIG. 41A is a close up schematic view of a via between flex circuits.

FIG. 41 is a schematic view of a bump pad via between flex circuits.

FIG. 42 is an exploded perspective view of a series of flex circuits in parallel arrangement on a housing.

DETAILED DESCRIPTION OF THE DISCLOSURE

Figure 1:
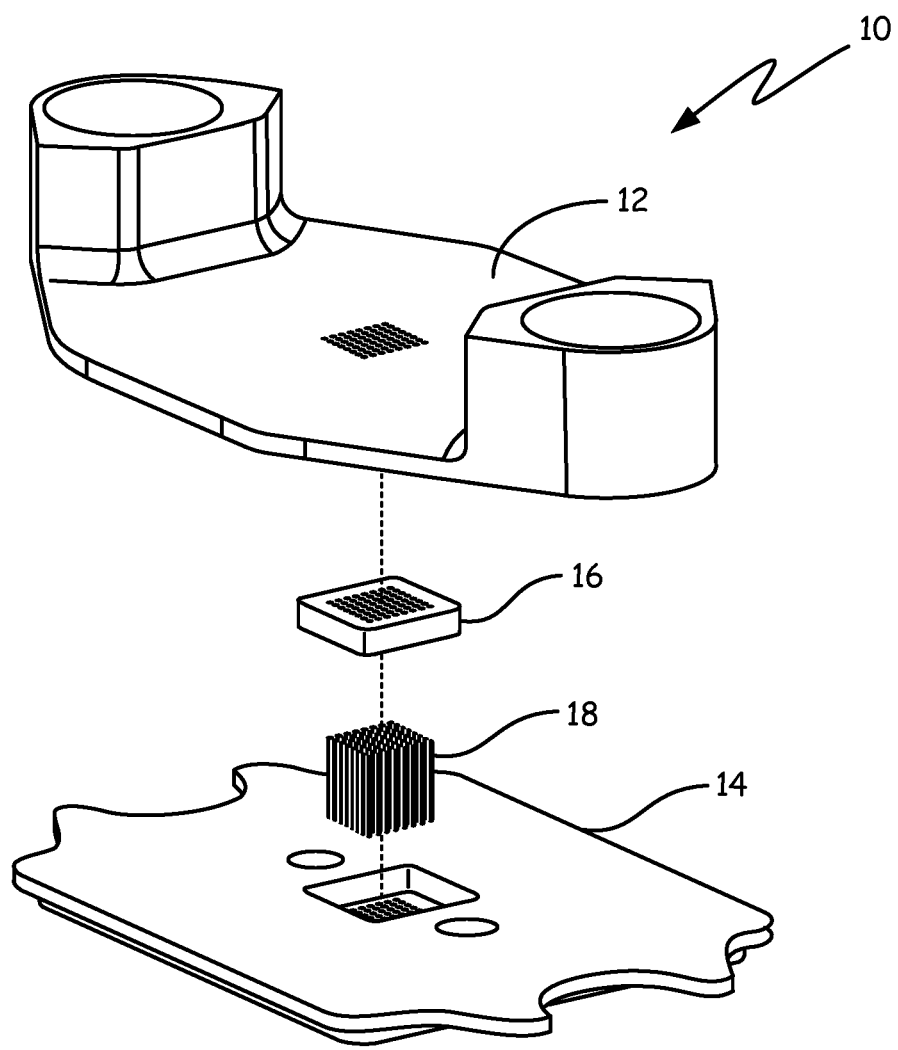
FIG. 1 is an exploded perspective view of a probe array, minus the top probe guide.

Consider an electrical chip, i.e. an integrated circuit that is manufactured to be incorporated into a larger system. When in use, the chip electrically connects the device to the larger system by a series of pins or terminals. For instance, the pins on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. It is even more desirable to test the chips while they are still on the wafer from which they were formed. Such chips are called dice or an individual die, which can be tested in situ by a prober (robot) which moves from die to die with a matrix of test pins aligned to engage the die pads perfectly. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "die under test" (DUT), is tested, and is then detached from the tester. In general, it is desirable to perform the probe movement to the die and testing, as rapidly as possible, so that the throughput of the tester may be as high as possible.

The test systems access the chip circuitry through the same pins or terminals that will later be used to connect the chip in its final application. As a result, there are some general requirements for the test system that perform the testing. In general, the tester should establish electrical contact with the various pins or terminals so that the pins are not damaged, and so that a reliable electrical connection is made with each pin.

Furthermore, at the wafer level, the probes are so closely packed together, it is a technical challenge to find a way to connect leads to the probes and then on to the probe card or equivalent.

A general summary of the disclosure follows.

The terminals of a die under test, DUT, at the wafer level are merely pads on the IC die and are probed by a robotic device which moves a probe array into contact with the die. The probe will be brief but under a predetermined amount of force and the probe array must be able to absorb the force without damage. Then the die/DUT is tested and the probes must carry signals in and out of the chip to a probe card, (a term used to characterize the circuit downstream from the probe array, and which may or may not be a physical pc board), and the retract and move to another chip, not necessarily adjacent due to heat dissipation issues. Because the probe array is tightly packed, getting leads into the matrix to extract the signals to a probe card or equivalent is problematic. The present disclosure provides a solution which groups the proximal (nearest the probe card/farthest from the DUT) probe ends in to groups according to height with the tallest ones in a central region and progressively shorter probes grouped together and surrounding the taller probes to progressively form a staggered structure with tallest probes toward the center and progressive rings of shorter probes toward the perimeter. Circuit boards, such as flex circuits corresponding to the number of subgroups, are stacked on each other and have proximal ends with connectors which reach to the various proximal probe ends in groups according to their probe subgroup. The tallest probe(s) receive a connector from a first flex circuit which reaches to such tallest probe(s). The next tallest probe subgroup is reached by the next flex circuit in the stack which has a plurality of connectors which surround the central region but have a void/aperture to allow the taller probes to pass therethrough to the prior flex circuit connectors. Thus the stack of flex circuits have progressively larger voids/apertures to allow the prior subgroup of probes to pass therethrough. In this manner all of the probes in the matrix will be connected to a flex circuit without crossovers.

The preceding paragraphs are merely a summary of the disclosure, and should not be construed as limiting in any way. The test device is described in much greater detail below.

It will be understood that the terms top and bottom may be interchanged as they depend on the user's orientation.

Turning to the figures, FIG. 1 illustrates the bottom of a test system 10 without the probe card, DUT/IC or prober, all of which are known in the art. The system includes a lower probe guide 12, and upper probe guide 14, a matrix/plurality of test probes 16 and an elastomeric block 18. It is noted that block 18 can be any bias material, including springs or elastomer tubes and the term "block" is to be interpreted broadly as such. The preferred form is a plurality of tubular resilient members around each probe. They may or may not be joined together by bridges (to keep them unified). Such a structure will also be referred to as an elastomer block.

The upper and lower probe guides are plates which have apertures or slots which allow the passage of probe 18. They may be slotted with a particular profile to prevent rotation of the probes if desired. The preferred material is ceramic but in any case a nonconductor or a conductor over coated with an insulator.

Figure 2:
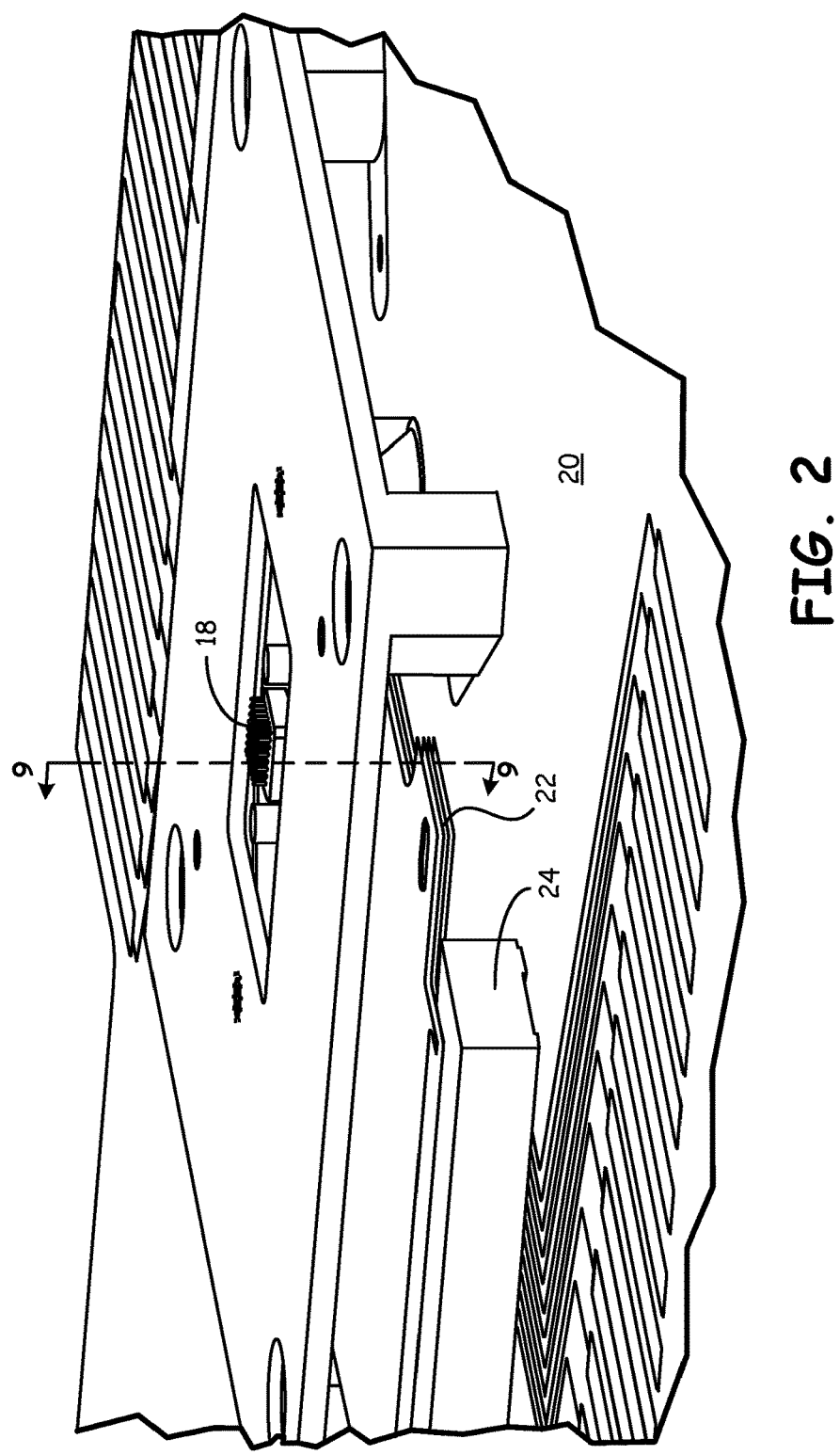
FIG. 2 is a perspective view of the probe array with probes protruding to their up stop position.
Figure 3:
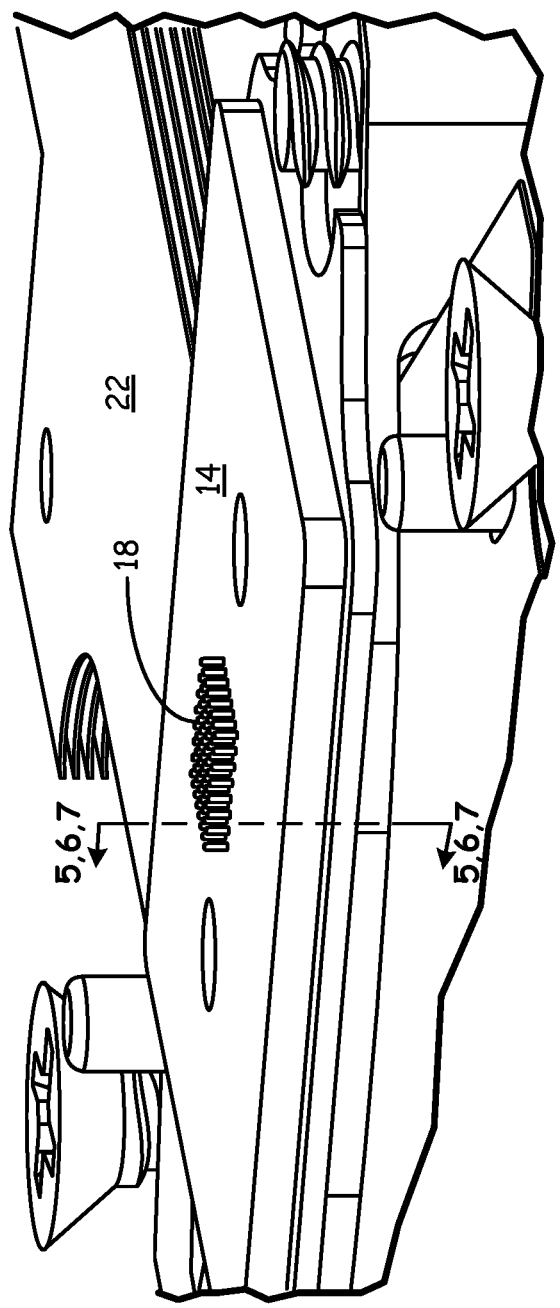
FIG. 3 is close up of FIG. 2.

FIGS. 2 and 3 are top views which show the probes 18 as they extend through the top guide plate. The distance they extend out of the guide plate is determined by an up-stop feature explained below. The probe card 20 provides a circuit board to apply signals to the DUT. Interconnection between the probes 18 and load board 20 is by virtue of a plurality of flex circuits 22 and connection block 24.

Figure 4:
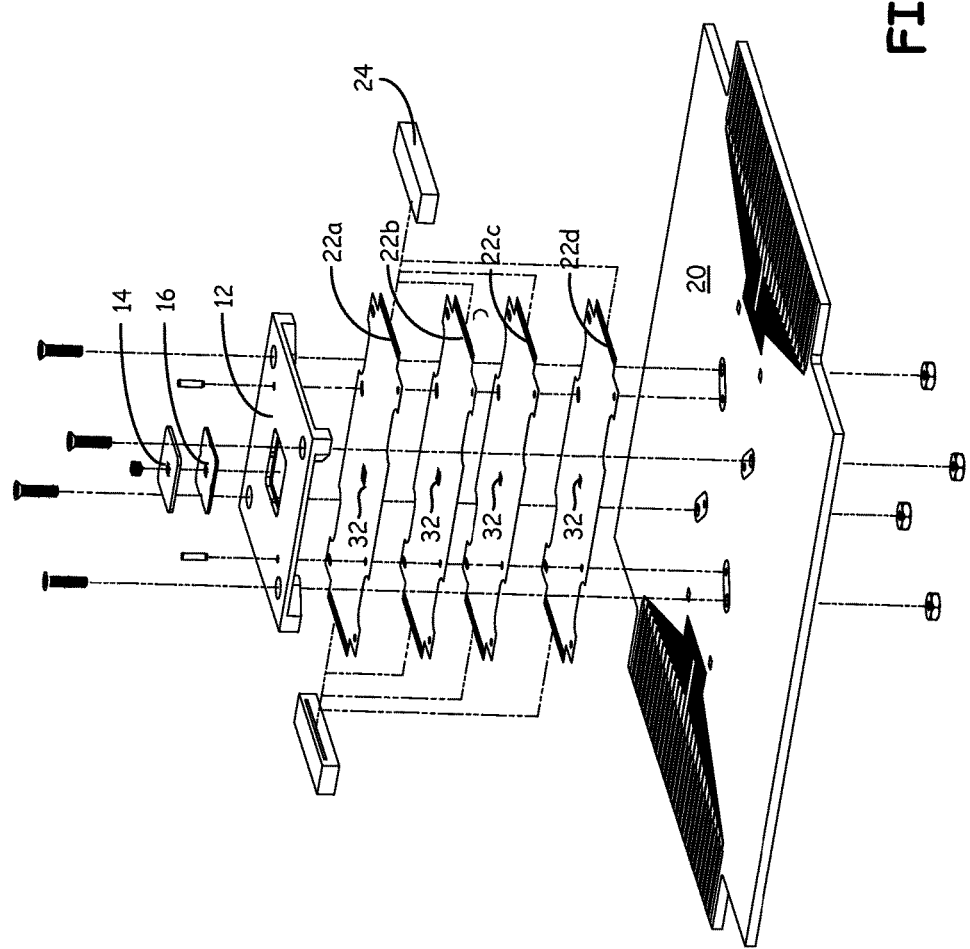
FIG. 4 is an exploded perspective view of the probe array.

FIG. 4 illustrates the various layers of the preferred embodiment. In this embodiment, the upper probe guide 14 is received within the lower probe guide 12 and is retained therein by a circumferential edge on the lower probe guide which retains the upper probe guide. The elastomer can be a block or a plate with a block portion as shown. The flex circuits 22 are shown in layers 22*a, b, c,* and *d* corresponding to the layers one atop the other.

Figure 5:
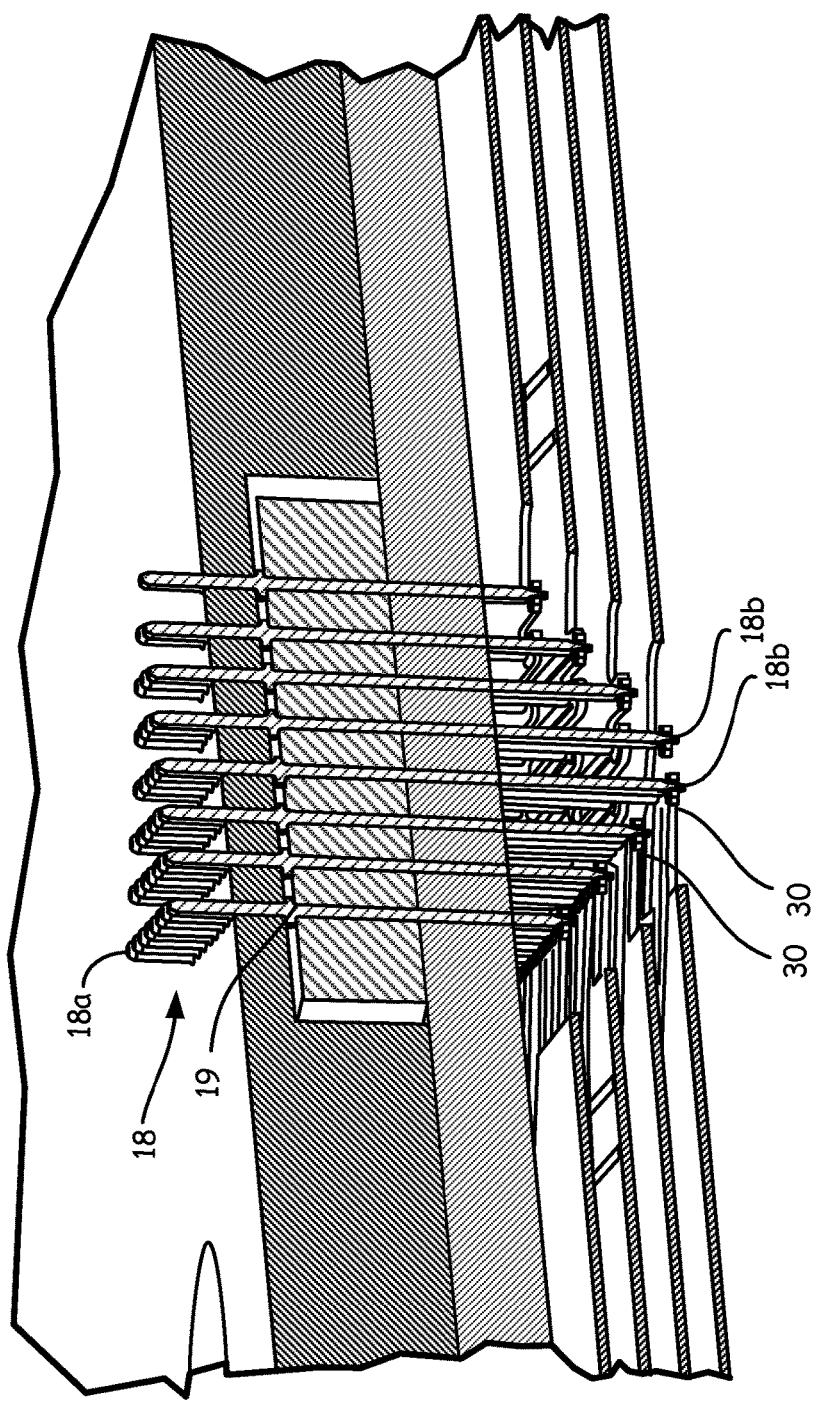
FIG. 5 is a side perspective view with portions broken away of the pin structure, elastomer and flex circuits.

FIG. 5 illustrates the up-stop feature on the probes and the interconnection between the probes and flex circuits.

The probes 18 have a distal end/or probe tip 18*a* which engages the DUT at its contact points/pads. The tip can be many shapes as shown in US Publication No. US-2013/0002285-A1 hereby incorporated by reference. The proximal end 18*b* of probe 18 is preferably pointed so that it can be received and electrically engaged, perhaps soldered to contact points 30 on the flex circuits 22.

Intermediate the ends 18*a*/18*b* is a cross member 19 which can be an orthogonal extension tangential to the longitudinal direction of the probe or generally an increase in the diameter of the probe. The function is to provide an up stop point for the probe so that it extends out of the upper plate a predetermined distance which is suitable for the prober.

Sandwiched between the upper and lower guide plates is an elastomer, preferably a block of compressible resilient material. It may be other elastomers including a plurality of springs or a combination of elastomers of different layers with different modulus of elasticity or resistance to compression if the probe deflection force needs to be nonlinear or follow some preferred response.

In order to get signals in and out of the DUT via the probes, it is necessary to provide an interconnect between the probes and probe card. In the preferred embodiment, this is achieved by flexible circuit boards 22 which include at their distal end, a plurality of traces and connection terminations 30 with holes to receive the sharp/dagger ends of the probes 18.

Figure 8:
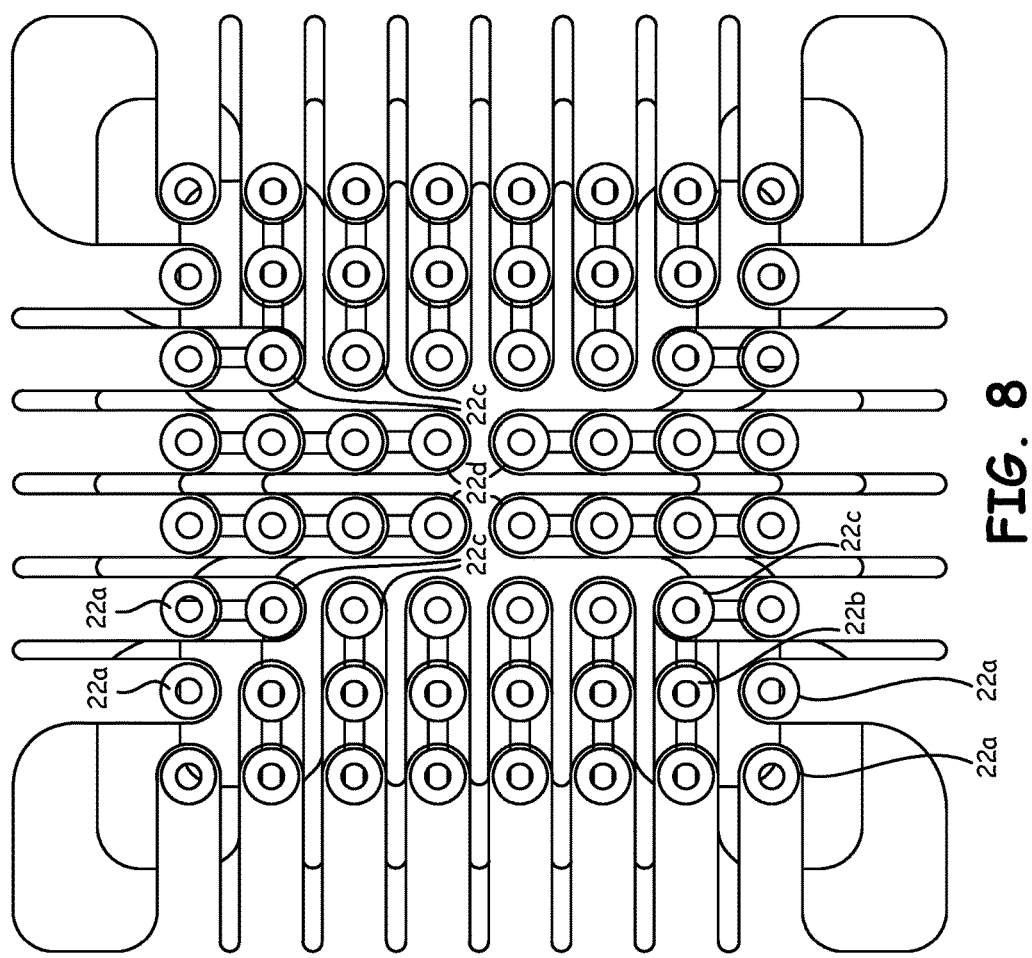
FIG. 8 is a plan view of the matrix of flex circuits as they are seen from the top or bottom.

In order to reach all probes, it is necessary to adapt the length of probes into subgroups according to height with the tallest probes (tallest with respect to the lower probe guide) are in the center of the matrix (central region). FIG. 8 is a top view of the flex circuits. Flex circuit 22*d* and connection pads 30 populate the innermost and tallest probes. The next flex circuit reaches to the next highest subgroup of probes which surround the first group. To achieve this flex circuit 22*c* has a void/aperture 32 sufficient to allow the passage of the tallest probes through to flex circuit 22*d*. Looking to FIG. 4, 4 layers of flex circuits are shown 22*a*, 22*b*, 22*c*, and 22*d*, and apertures 32 are progressively larger from 22*d* to 22*a* so that the longest probes in the central region can reach the lowest flex circuit 22*d* and each ring or surrounding probe subgroup will reach progressively shallower flex circuit contacts until the last flex circuit 22*a* will make contact only with the shortest probes at the outermost peripheral edge of the probe matrix.

Figure 6:
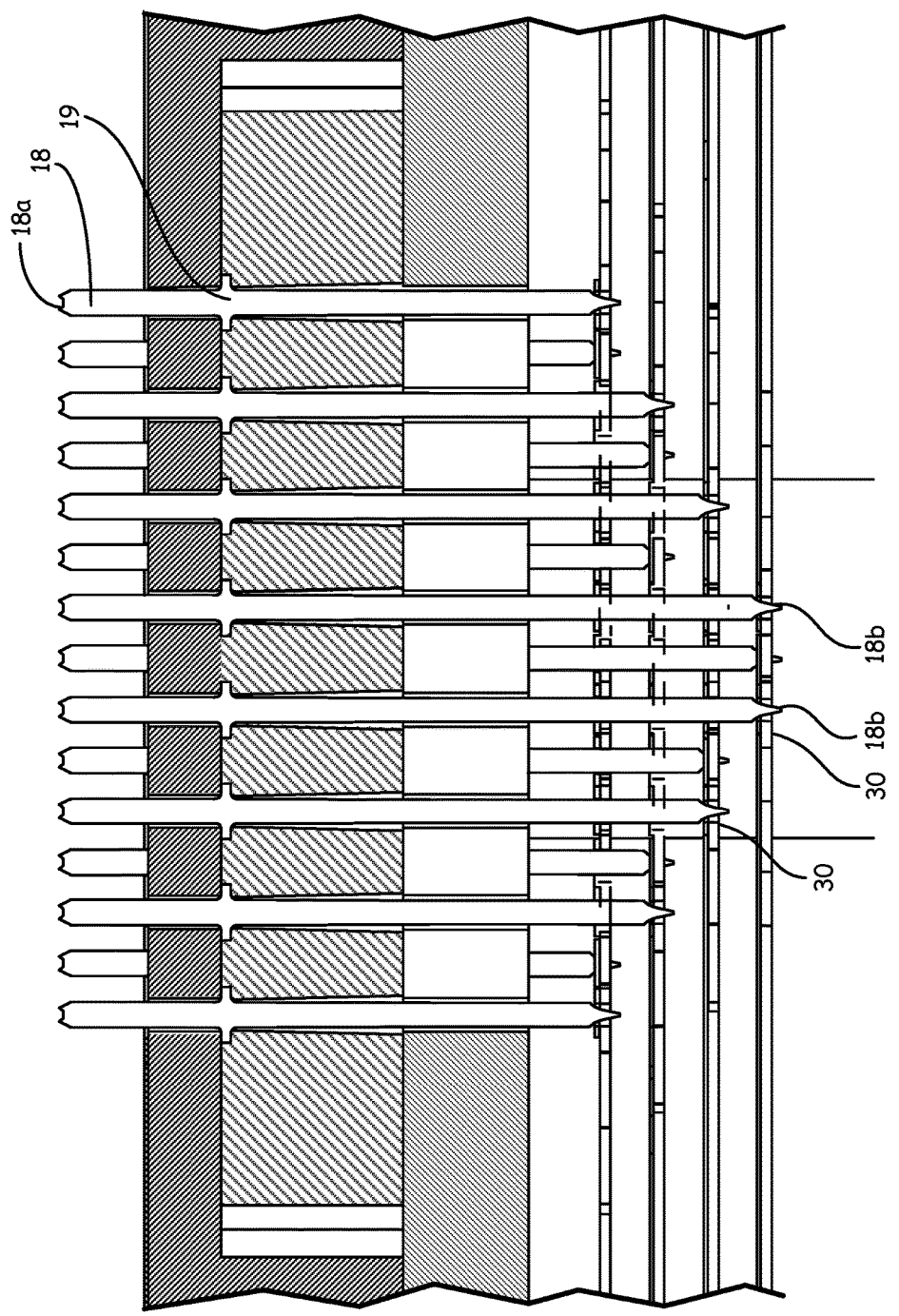
FIG. 6 is a side plan view of FIG. 5.
Figure 7:
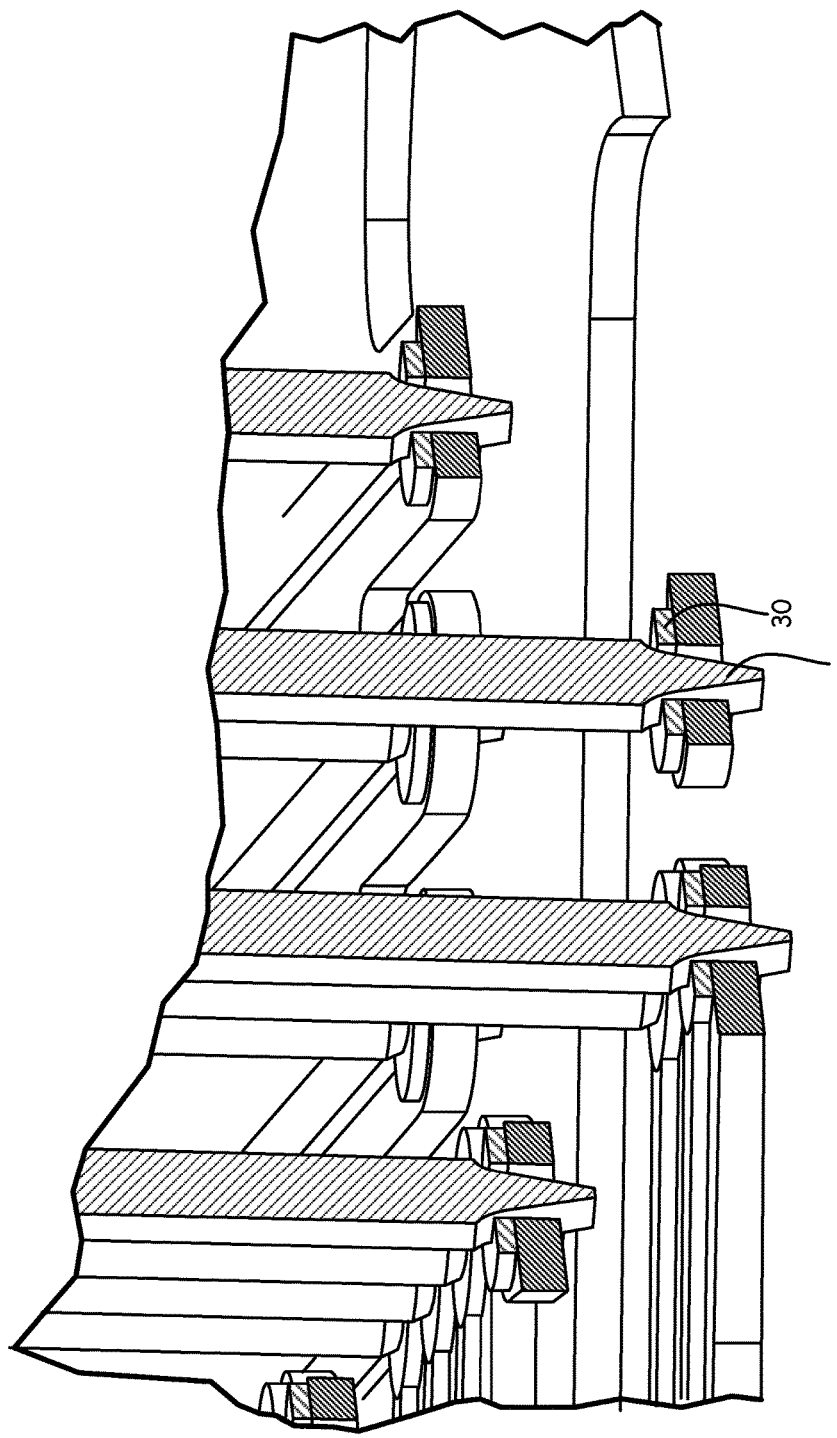
FIG. 7 is a close up side perspective view of the engagement between the bottoms of the probes and flex circuits.

FIG. 6 shows a close up view of the probes points 30, which are preferably donut-hole circular probes with a hollow center with the probe ends 18*b* passing partly therethrough or otherwise connected.

Figure 9:
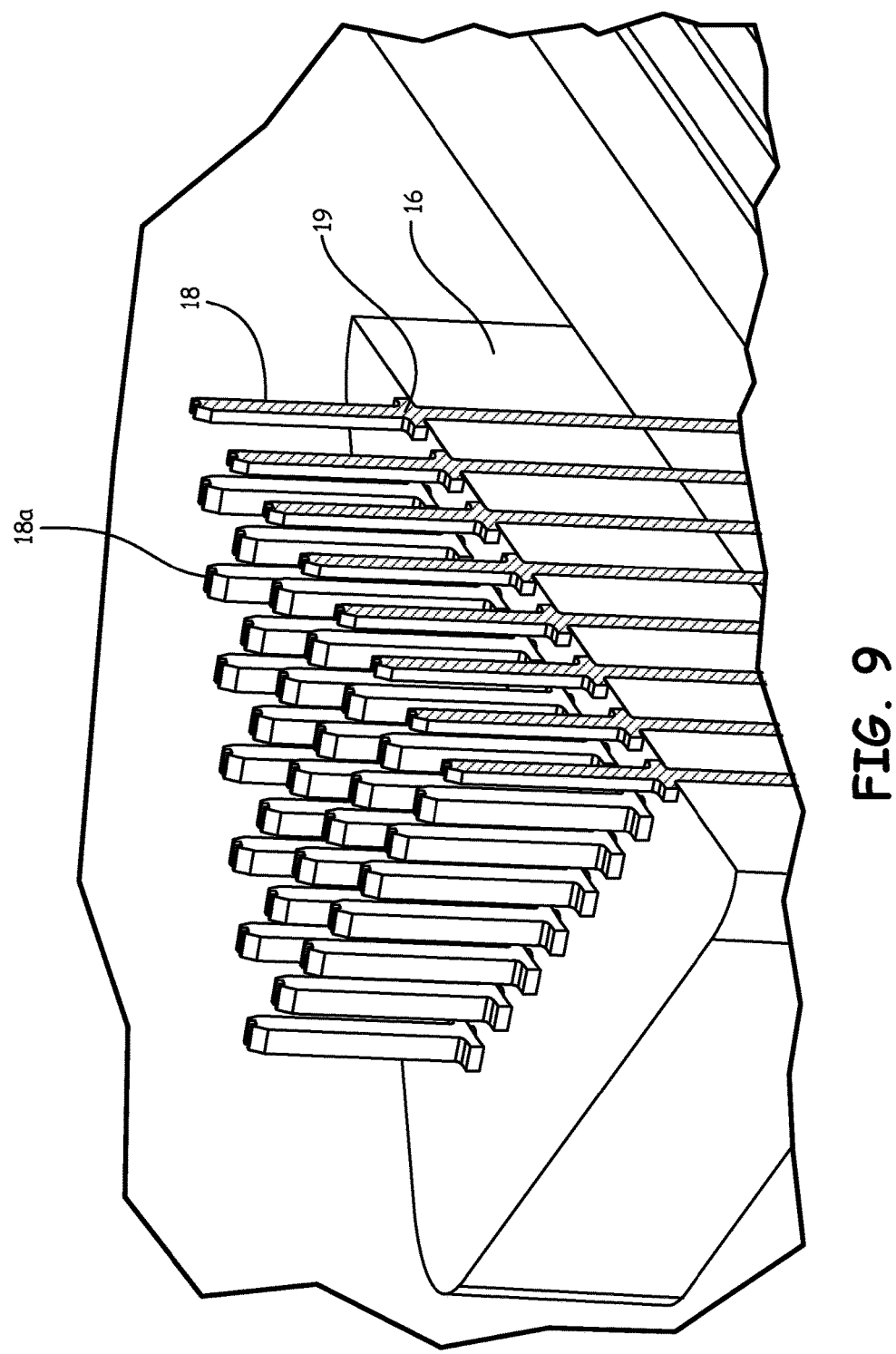
FIG. 9 is a perspective view of probes in their elastomer.

FIG. 9 illustrates a view with the upper guide plate removed, revealing the cross members 19 in abutment with the elastomer 16. As mentioned the cross member can be many configurations so long as they prevent passage of the probes through the upper guide.

Figure 10:
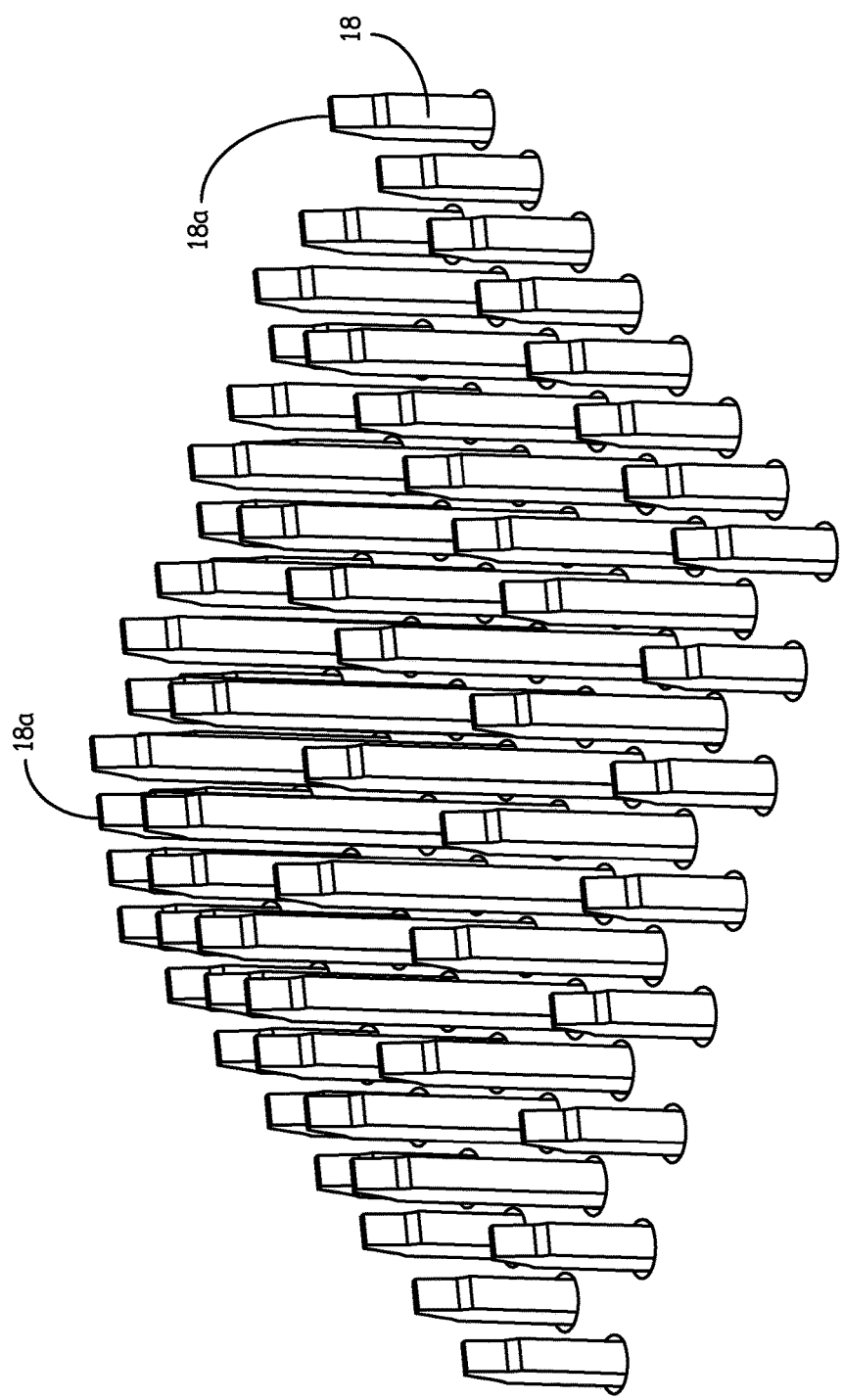
FIG. 10 is a perspective view of probes protruding from the probe guide retainer.
Figure 11:
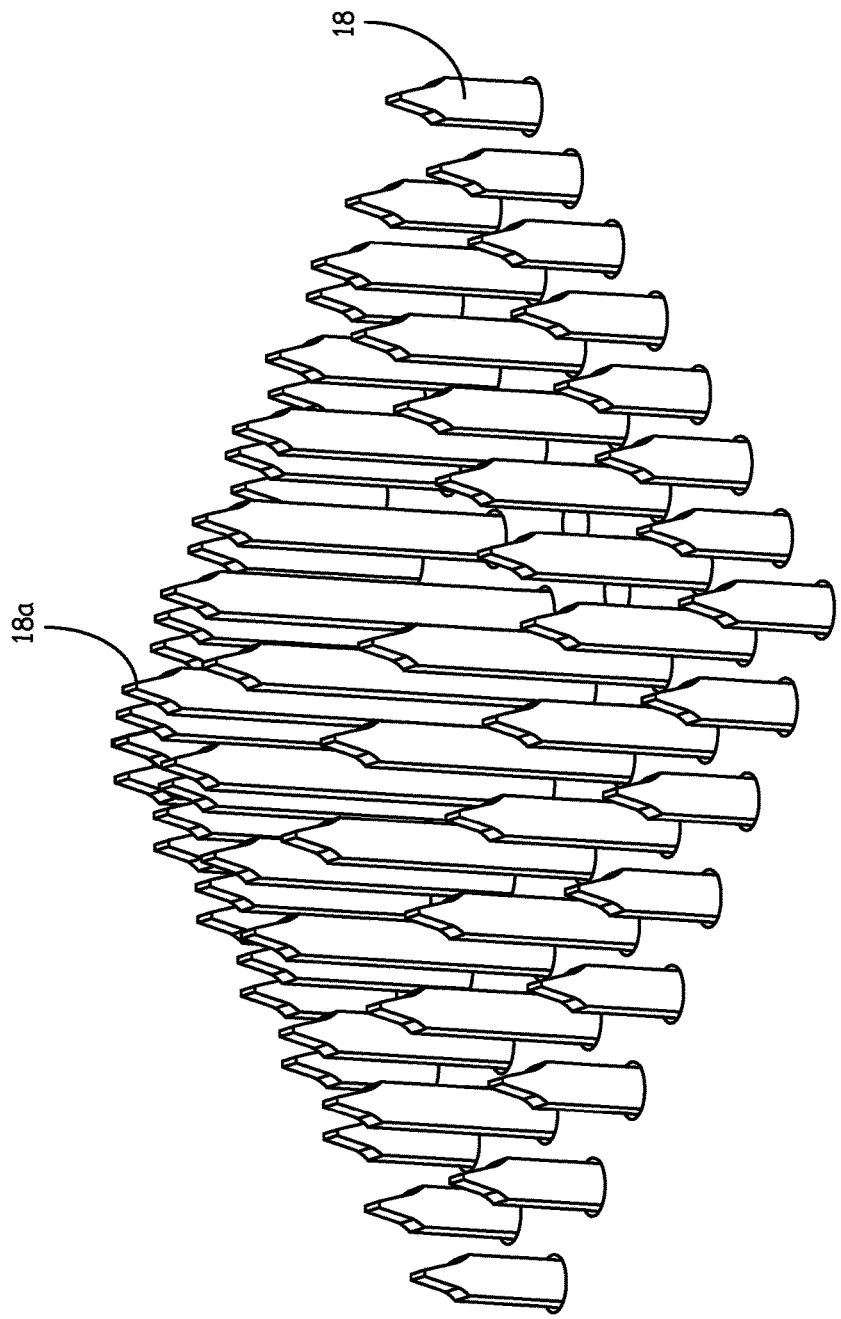
FIG. 11 is a view like FIG. 10 except rotated 90 degrees.

FIGS. 10 and 11 show the probe tips 18*a* from two angles. The preferred construction is a hollow point twin peak design though this disclosure contemplates other shapes.

In addition to the structures disclosed, methods of manufacture are disclosed.

For example, a method of connecting making electrical connections to ends of a matrix of electrical test probes in a testing system for testing integrated circuits is disclosed having any or all of the following steps in any order.

a. adapting, such as but forming or cutting, the length of the probes in the matrix of test probes, into subgroups of differing heights, wherein the first subgroup contains at least the tallest probes, and where the tallest probes are to be located in a central region, like a skyscraper and wherein the second and successive subgroups contains probes progressively shorter than the adjacent subgroup of taller probes and wherein the probes of the successive subgroups contain probes which surround the adjacent taller subgroup, so that the probes together form a staggered structure with the tallest probes in a central region and probes of every diminishing height there around;

b. providing a plurality of stacked circuit boards, such a flex circuit boards or other traces or leads, the number preferably at least corresponding to the number of subgroups, each board having connectors configured to reach a respective set of subgroup probes ends; wherein the first of said boards being on the bottom of the stack and the next successive boards being placed atop said board and wherein each successive board includes an aperture or in the central region sufficient to allow taller probes to pass therethrough without engaging that board; so that the tallest probes will engage the bottom board and shorter probes will engage successive boards.

Also disclosed is a method of testing integrated circuits (IC) with a matrix of probes having a top and bottom end, said probes corresponding in position to test pads on the IC, having any or all of the following steps in any order of:

a. forming, such as by milling or casting, an upper probe guide plate with a plurality of slots to receive the top end said probes, the slots may be shaped to prevent rotation of the probes, b. forming a bottom guide plate with a plurality of slots to receive the bottom end of said probes;

c. forming a portion on said probes between said ends with an increased cross sectional diameter, such as a bulge or flare or cross member etc.; said diameter being larger than said slot on said upper plate, and thereby forming an upstop;

d. forming an elastomeric block around probes between said upper and lower plates, and below said upstop; the block can also be springs or other bias element;

so that, said elastomer will drive said increased diameter toward said upper plate thereby providing a bias force on said probes toward said IC.

FIGS. 12-43 illustrate an alternate embodiment of a housing and pin array 110. The housing includes a plurality of pin groupings 112 each arranged to test a different die from a wafer. In this FIG. 4 dice can be tested simultaneously. A plurality of parallel stacks of flex circuits 120 carried signals to and from the pins array groupings 112 as will be explained herein. Underneath the flex circuit stacks 120 is a conductive bump interposer board 124 which includes an array of conductive vias 140 on a via plate 144 (not shown in this figure, but in FIGS. 36 and 41B) which carry signals from the flex circuits to the load board (not shown). The bump plate is a non-conductor with a plurality of conductive vias as shown in FIGS. 36 and 41B aligned with like contacts on the flex circuits and load board. A temporary shipping plate 150 is shown but a load board of known art would be substituted.

To maintain electrical contact between the flex circuits, bump plate and load board, clamping plates 148 with bolts and nuts are provided.

Figure 13A:
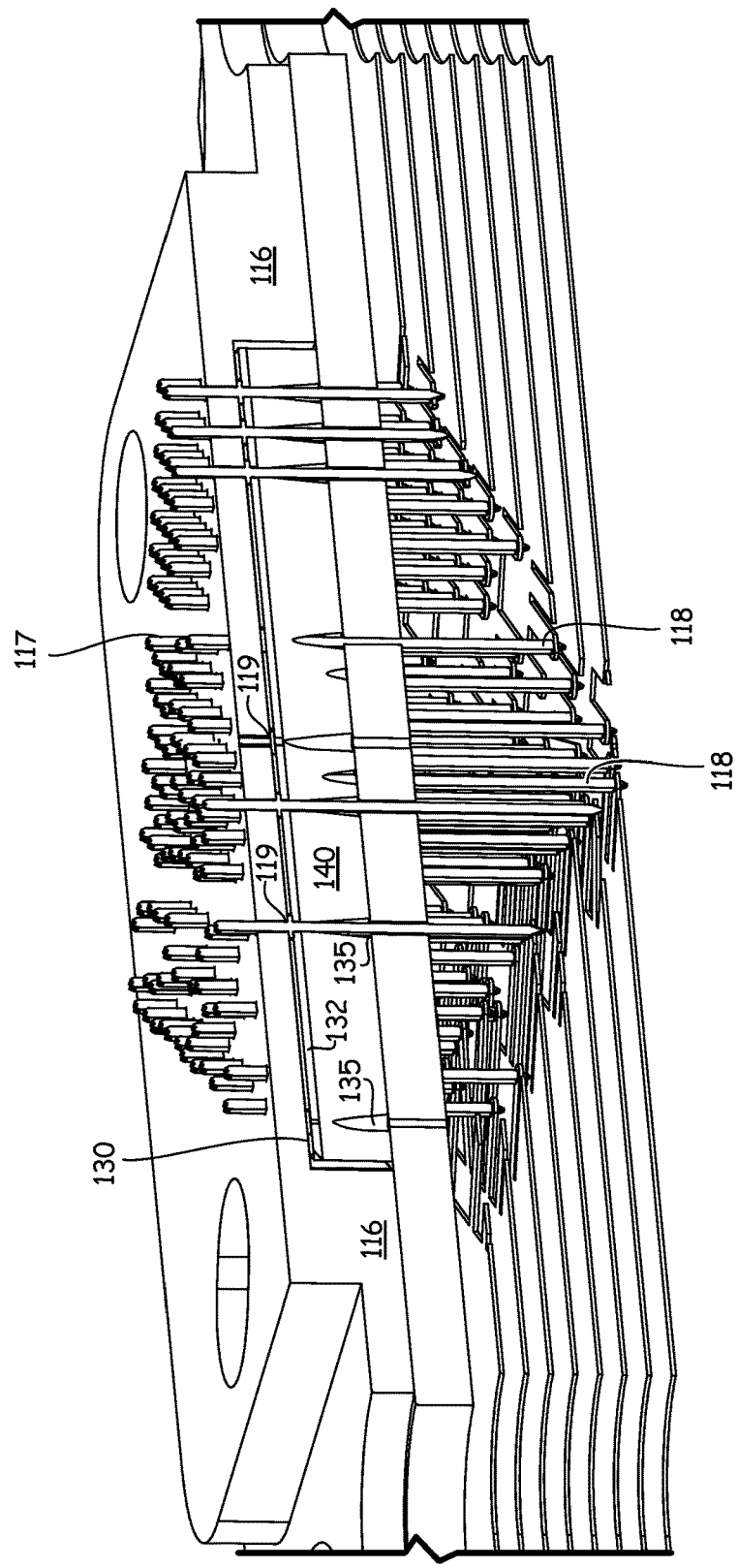
FIG. 13A is a figure like FIG. 13 except showing pins of different height.
Figure 13B:
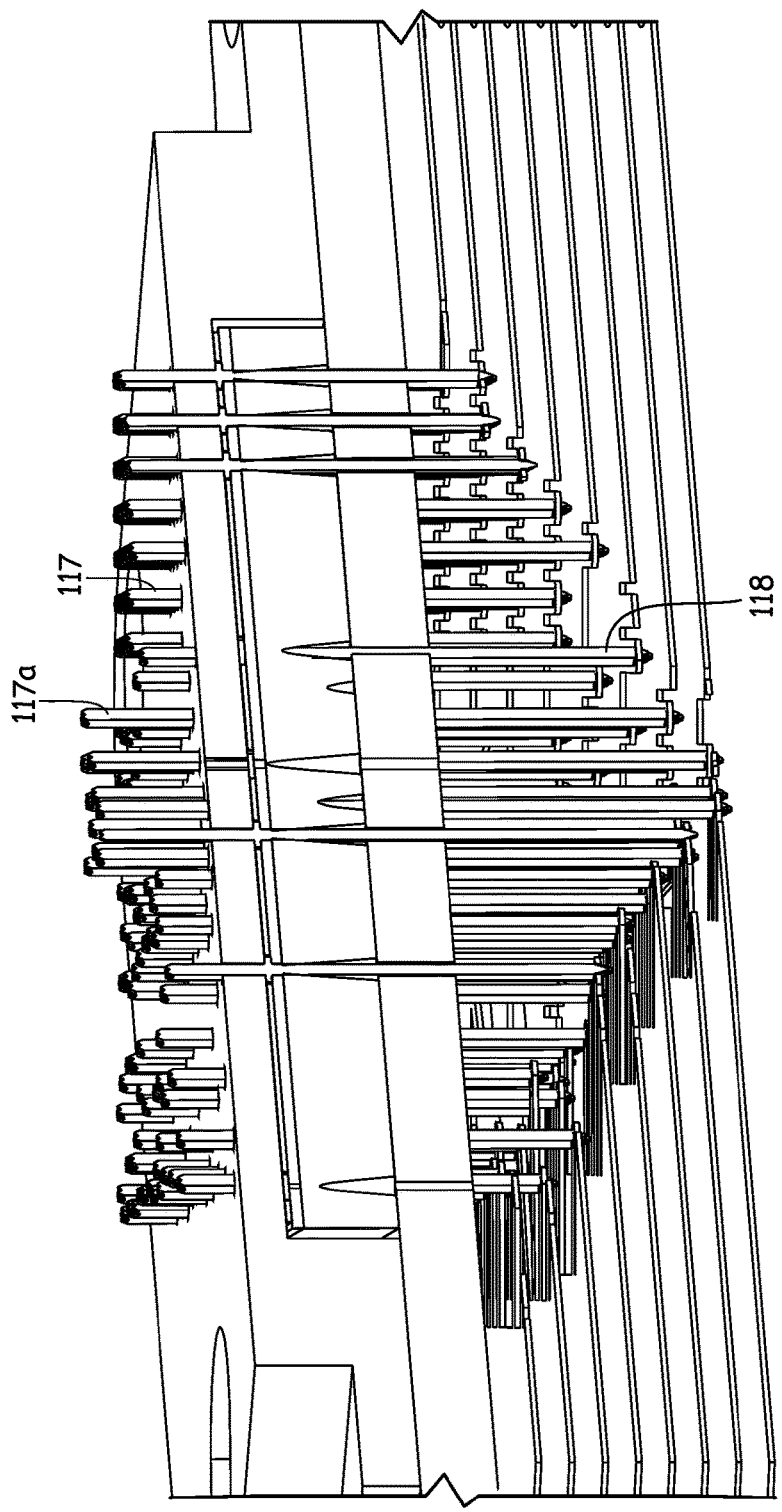
FIG. 13B is a side perspective view with portions broken away of FIG. 13A.
Figure 13C:
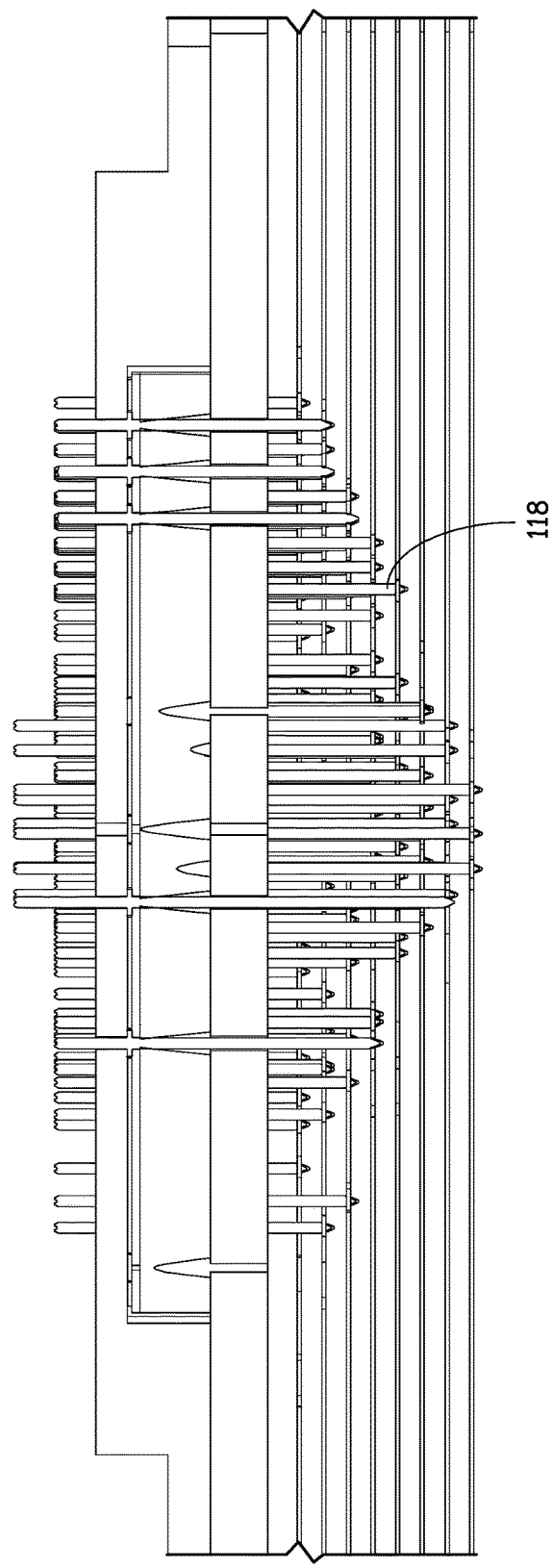
FIG. 13C is side plan view of FIG. 13B.
Figure 14:
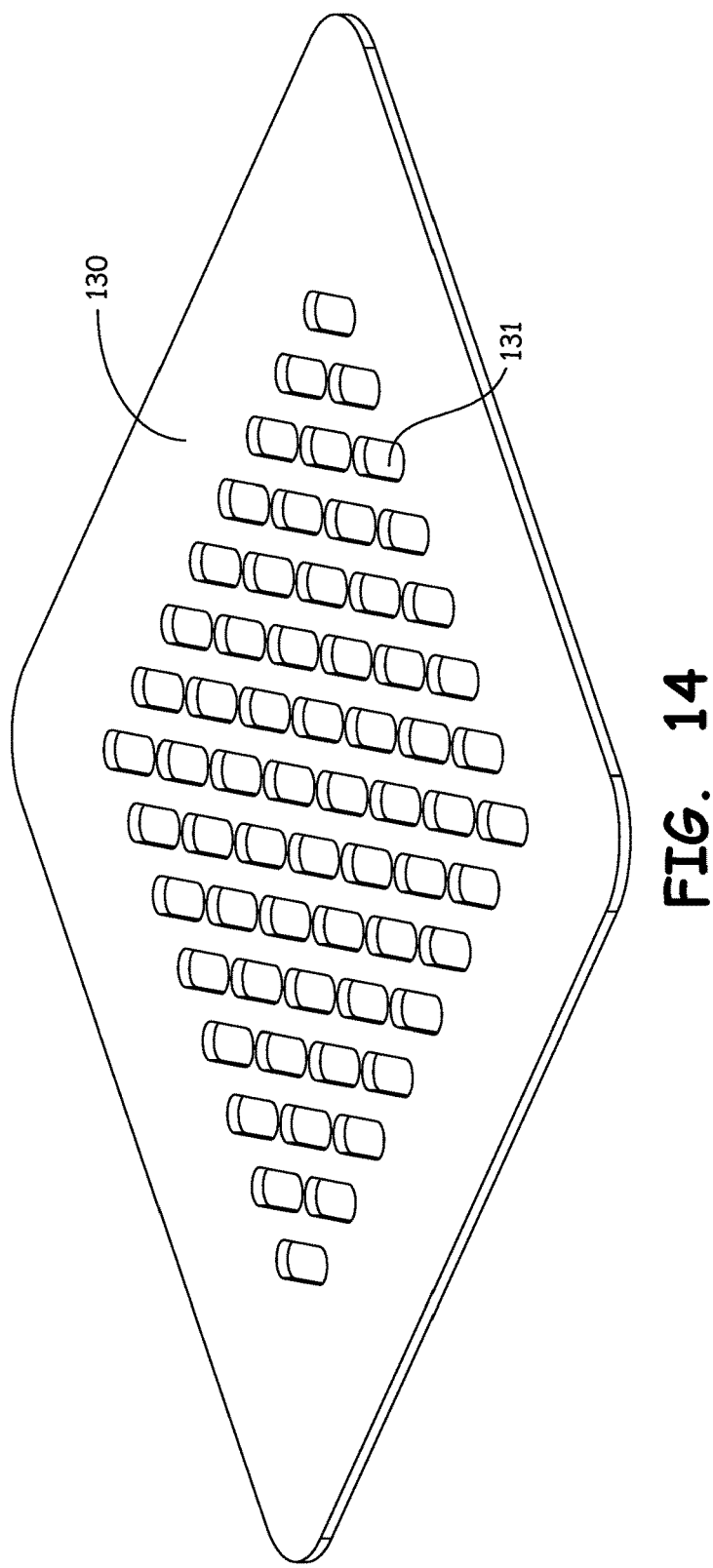
FIG. 14 is a top perspective view of an anti-intrusion plate.
Figure 15:
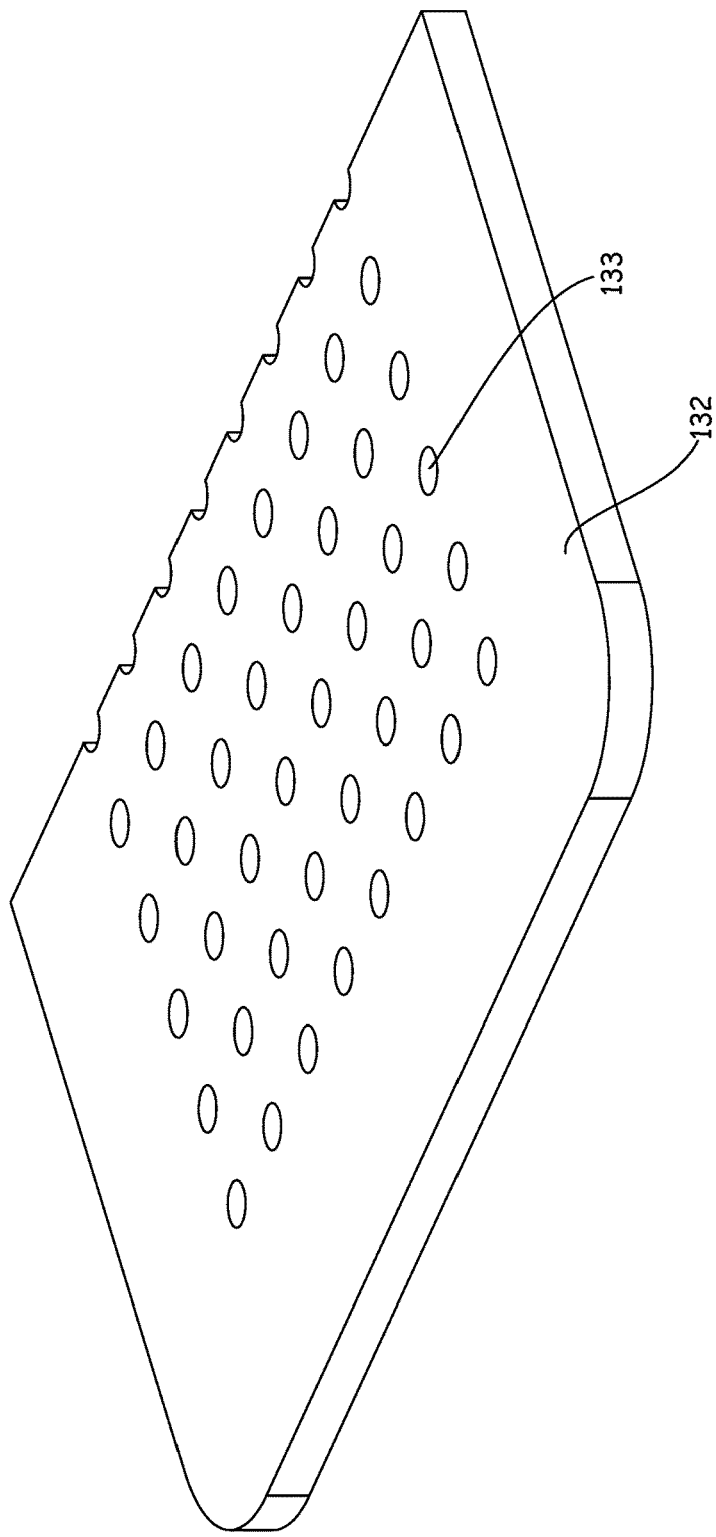
FIG. 15 is a figure like FIG. 14 showing the anti-intrusion plate transparently.
Figure 16:
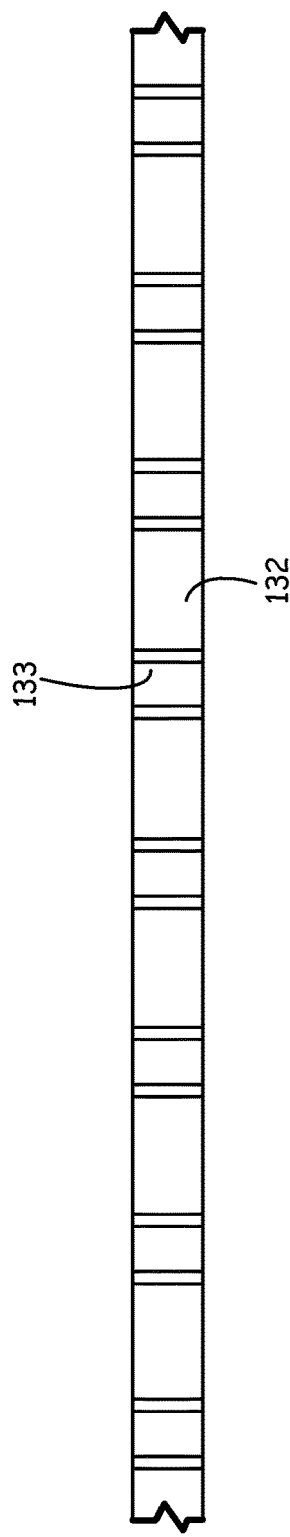
FIG. 16 is a side plan sectional view of FIG. 15.
Figure 17:
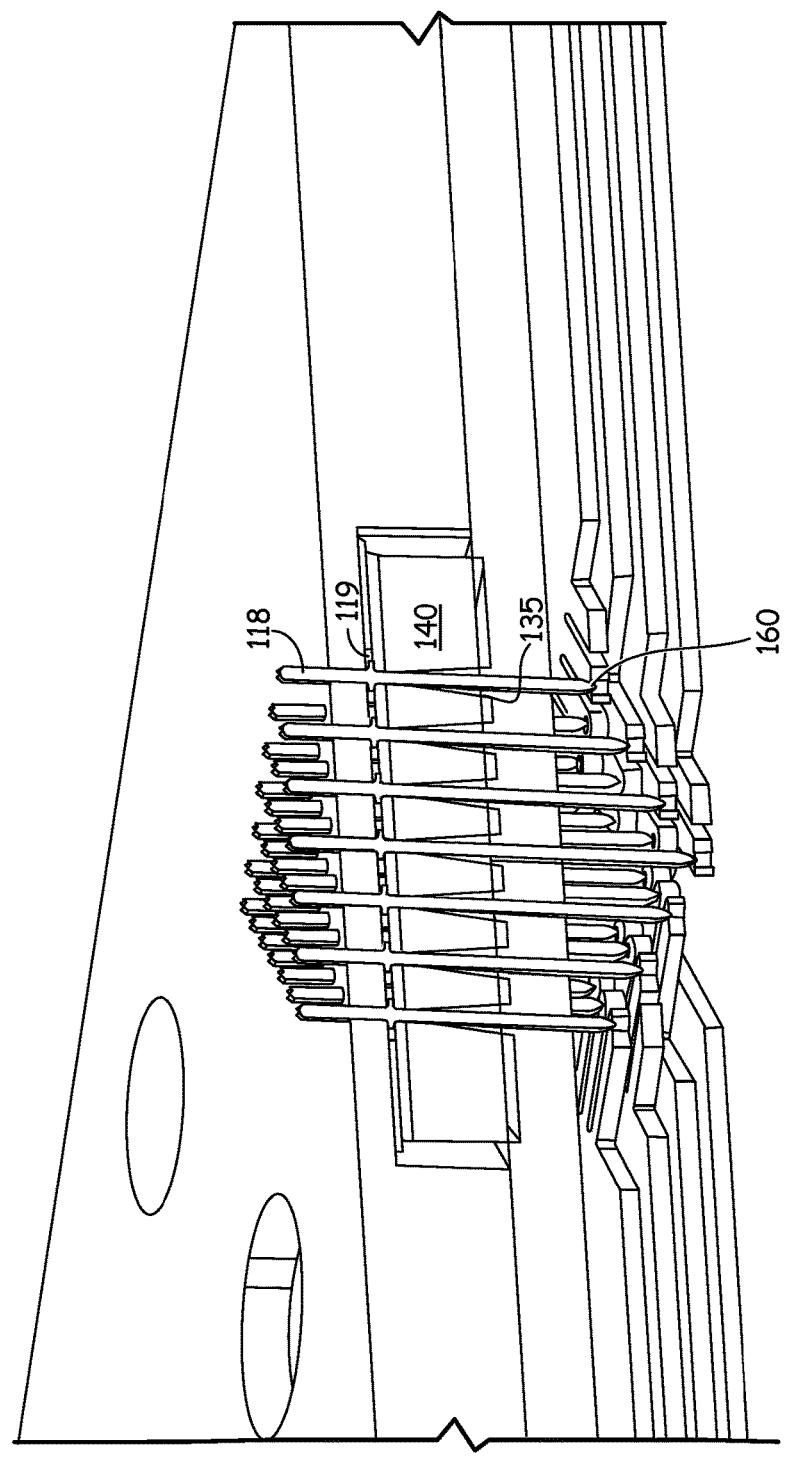
FIG. 17 is a close up view like FIG. 13.
Figure 18B:
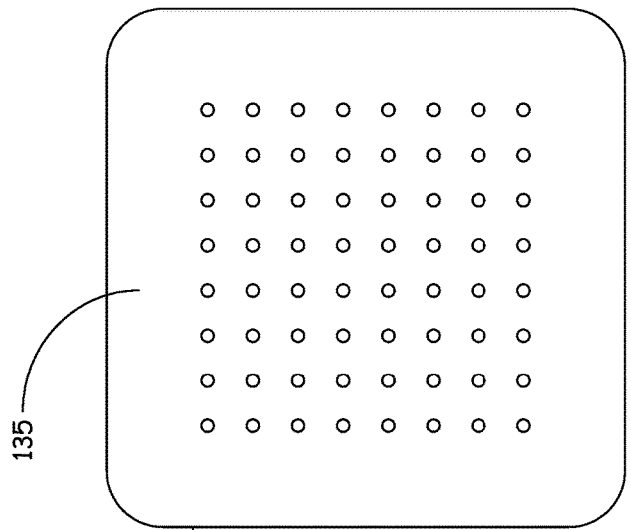
FIGS. 18A, 18B and 18C are perspective, top and side views of the elastomeric layer.
Figure 18C:
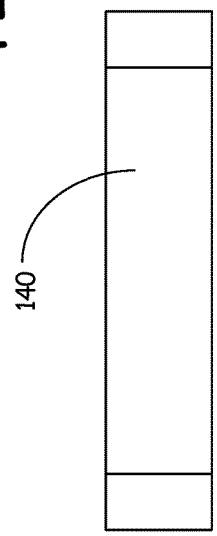
Figure 18A:
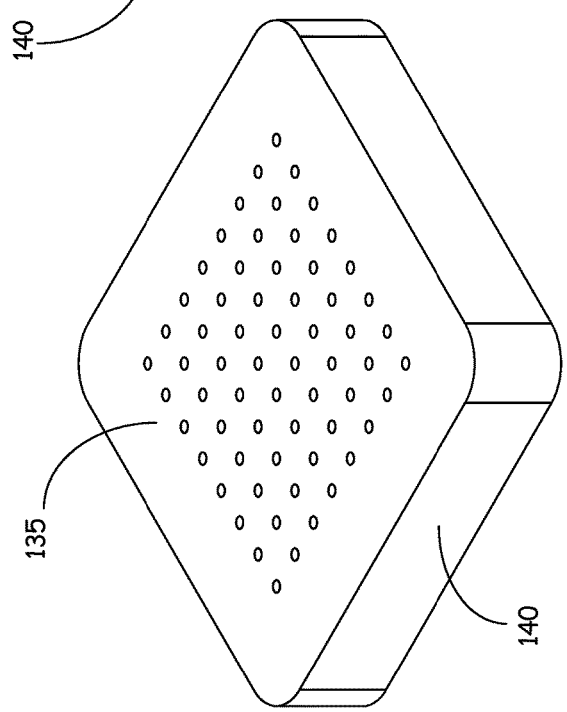
Figure 19A:
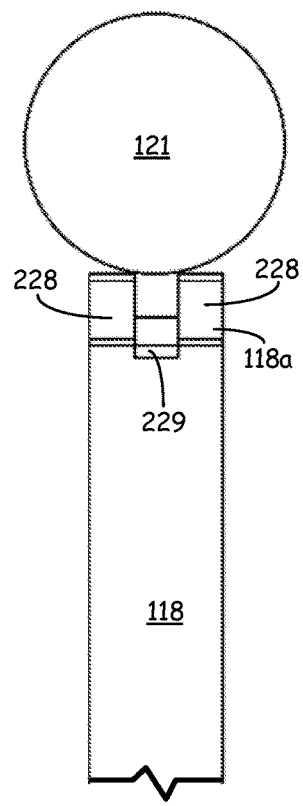
FIGS. 19A, 19B, 19C are partial side, top and partial side view of a pin and contact ball.
Figure 19B:
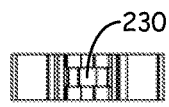
Figure 19C:
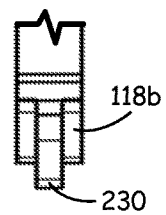
Figure 21A:
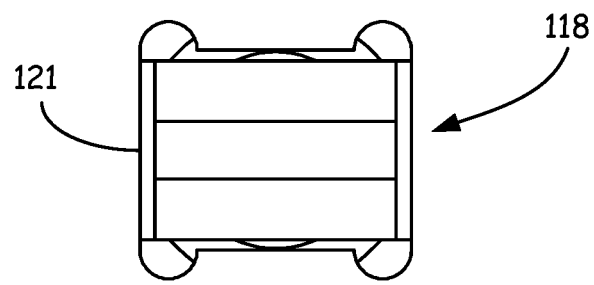
FIGS. 21A-21B are top plan views of pins in rectangular holes and round holes respectively.
Figure 21B:
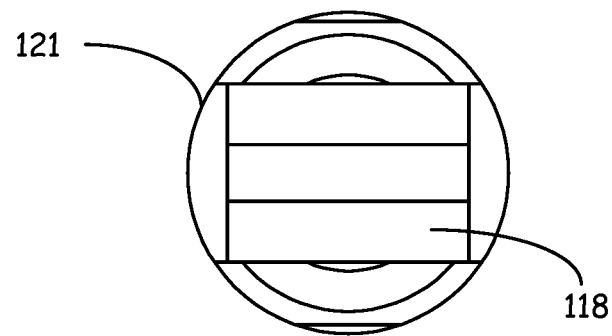

FIGS. 13-18 illustrate the construction of the pin array 112. Plurality of sliding pins 118, with pin tops 117 and 117a, of differing height, which are arranged in an array according to the pad or ball configuration of the die. In FIG. 13 it can be seen that this arrangement may not be rectilinear as in the prior embodiment but may have pins in any pattern as may be required. Pin height can also be variable/uneven as shown in some figures.

As in the previous embodiment (FIG. 5) pins 118 include cross members 119 (show in close up in FIG. 20B) which extend lateral and at generally right angles to the length of the pin. These provide either an up or down stop for the pin. The upper pin/probe guide 116 include a plurality holes to receive the pins. The holes can be round or rectangular if additional anti rotation guidance is needed. See FIGS. 21A-B. The guide plate can also be further aided by a separate alignment plate 130 (see FIG. 14 for detail) which includes a plurality of slots 131 shaped to receive the pins and prevent their rotation.

To prevent the cross members 119 from intruding into the elastomeric layer/elastomer 140, an anti-intrusion layer (AIL) 132 is interposed between the alignment plate 130 (if used) and the elastomeric layer 140. The AIL prevents the cross members from cutting into the elastomer and ultimately destroying it. Shown in greater detail in FIG. 15, the AIL 130 includes a plurality of holes 133 large enough to accommodate the pin shaft but not allow the cross member 119 to path therethough. The holes are of course aligned with the alignment and probe plate holes. Because the elastomer is resilient, downward deflection of the pins is possible by the bias pressure of the cross member on the AIL which in turn compresses the elastomer 140 but cannot penetrate it.

The elastomer is also especially designed with a plurality of tapered holes 135 (FIGS. 18A-B, FIG. 17, FIG. 13) which are likewise aligned with AIL holes. The holes in the elastomer are tapered from bottom to top as shown, and preferably with a conical shape. This taper has the effect providing strain relief on the pins and to provide a more linear force as the pins are deflected. Other hole shapes are possible so long as more material is removed from one end of the hole to the other to provide a place for elastomer deflection and prevent nonlinear compressive forces which would occur if there was build up. It would also be possible to hollow out a portion of the passage way in the elastomer holes for the same purpose.

This embodiment includes a plurality of pin upper/top tip and bottom tip geometries as shown in FIGS. 19-29. Pins 118 include a top tip 118a and a lower portion tip/end 118b. In FIG. 19A, a representation of a die ball contact 121 is shown. The pin upper tip 118a in FIG. 19A is forked having two lands 228 separated by a recess or trough 229. The trough provides great contact force on the lands by reducing the contact surface area and provides a debris catch/passageway. In FIG. 19C, the lower tip is shown with a center protrusion 230 which is sized to engage apertures in flex circuits (see below).

Figure 22A:
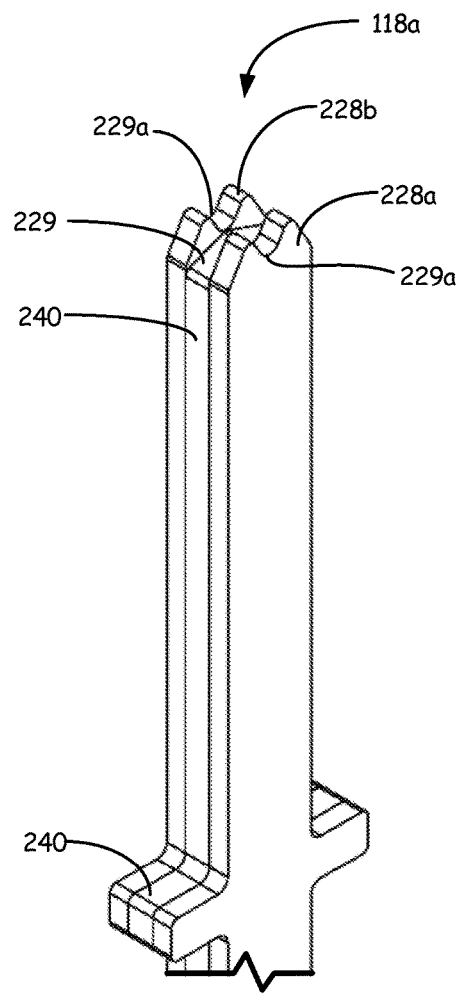
FIGS. 22A-22B are close up views of upper portion tow pin types, a kelvin (pin 22A) and a coaxial shielded pin (22B), additional views plan and perspective views of the coaxial pin 242 are shown in FIGS. 22C-22H.

FIGS. 20A-C illustrates and alternate 4 point crowned tip 228a-228b with a central valley 229 and arcuate valleys 229a, 229b on either side of the central valley/trough 229. A similar pin 118a with tip is shown in FIG. 22A, however this pin a kelvin type which has separate force and sense conductors 228a, 228b which are insulated from each other by a central insulating strip 240 which is non conducting and thus the conductive portions bonded on either side thereof carry the force and sense signals.

Figure 22B:
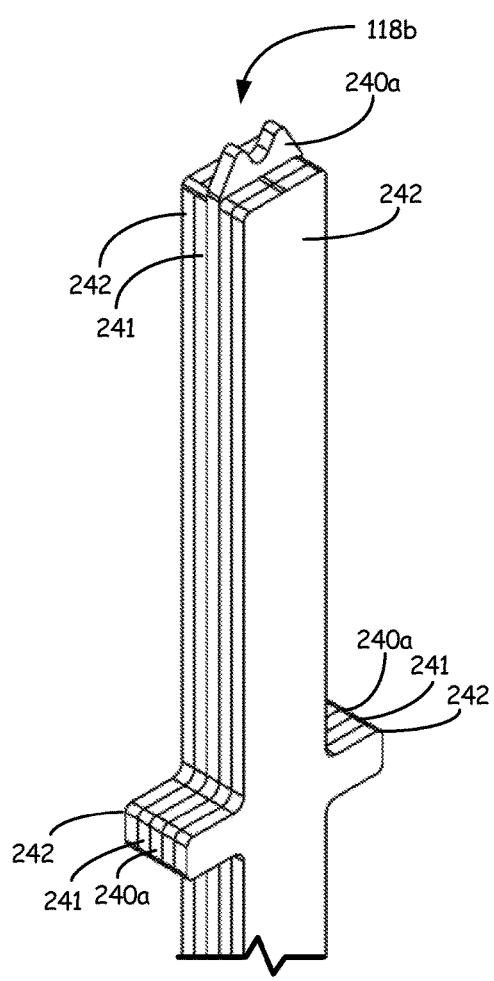
Figure 23:
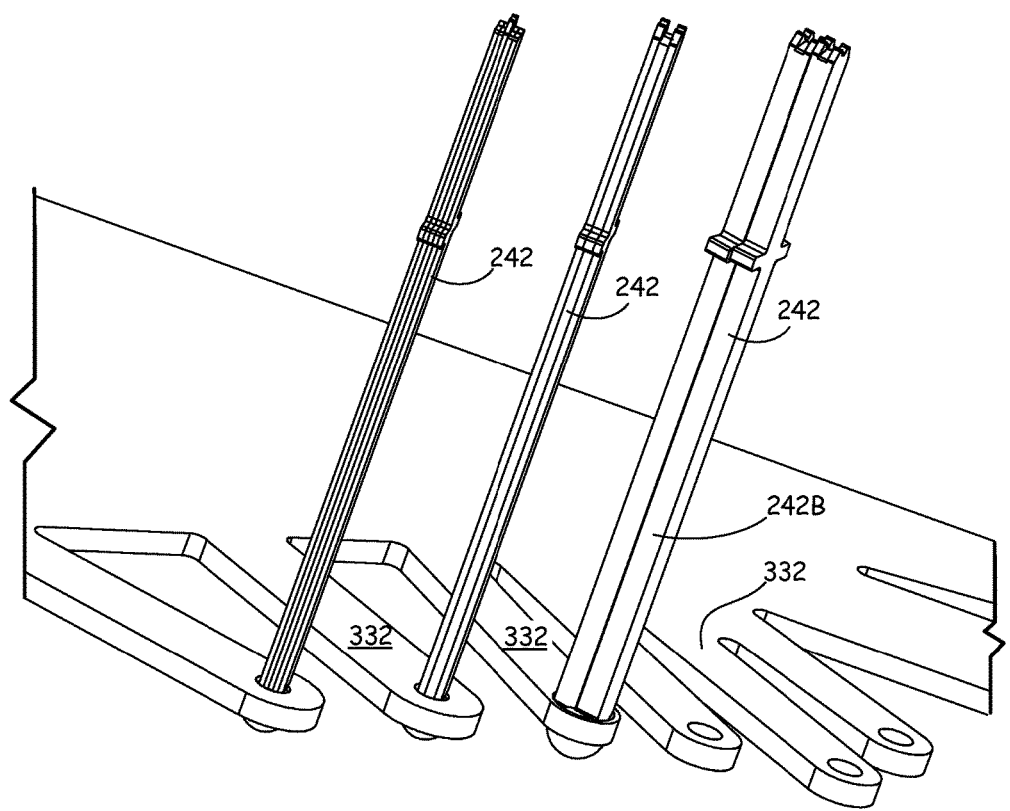
FIG. 23 is a perspective view of pins of various types in engagement with flex circuit connection points include a double side by side pin 242B.

FIG. 22B is a coaxial type pin 118b which has a central conductor surrounded on both sides by insulators 241 which provide a coaxial impedance match as may be needed for high frequency tests. Bonded to insulators 241 may be conductors 242 which can be used for shielding and to complete the coaxial structure. Such structures are also shown in FIG. 23.

Figure 24A:
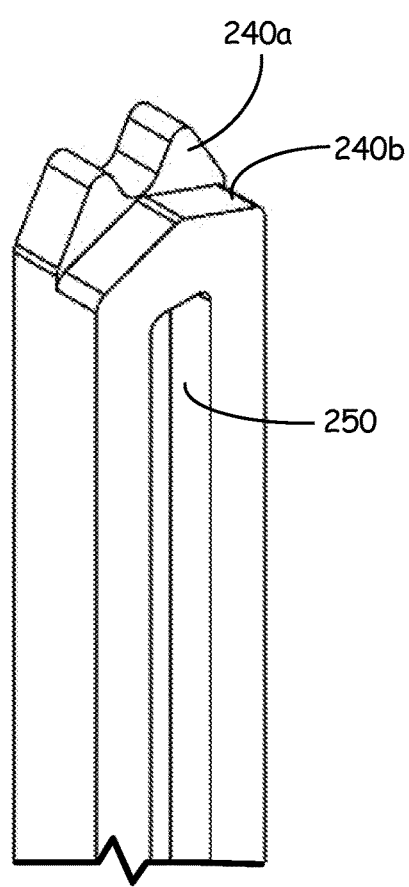
FIGS. 24A-24B are perspective views of pins with a channel for conductor inlays.
Figure 24B:
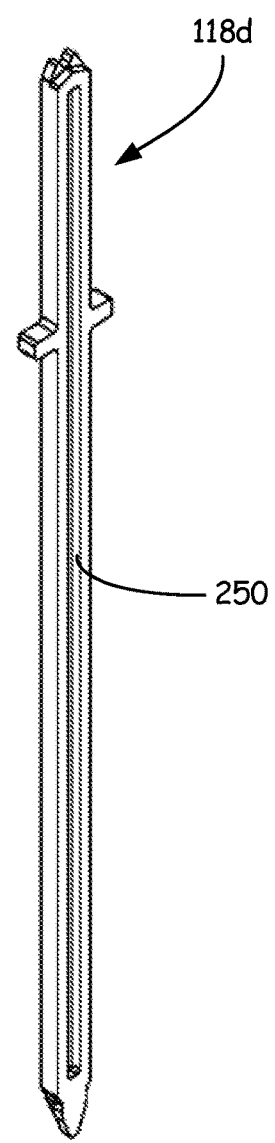
Figure 26A:
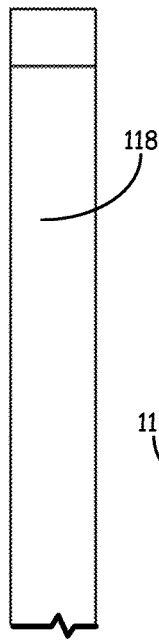
FIGS. 26A-D are partial views of a chisel style pin tip in side, front, other side plan view, and a perspective view.
Figure 26B:
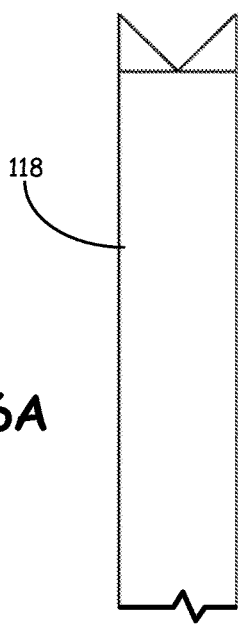
Figure 26C:
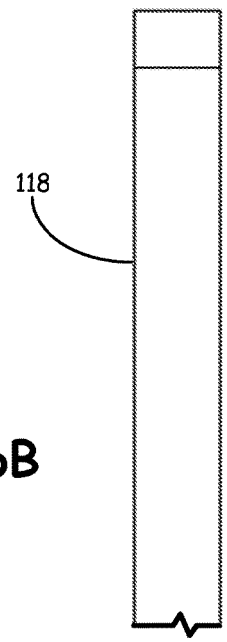
Figure 26D:
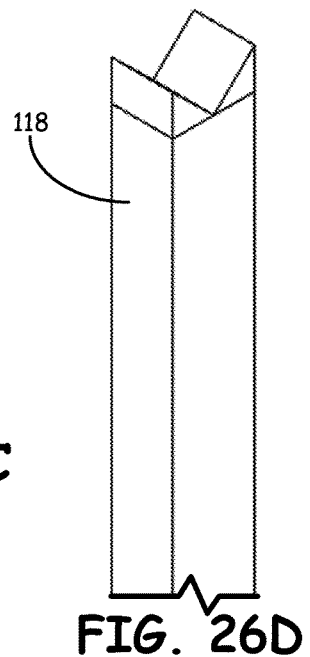
Figure 27A:
FIGS. 27A-D are partial views of a slant style pin tip in side, front, other side plan view, and a perspective view.
Figure 27B:
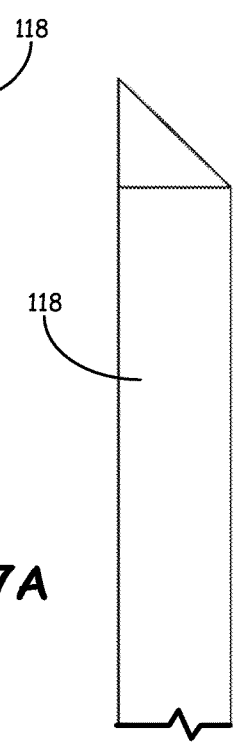
Figure 27C:
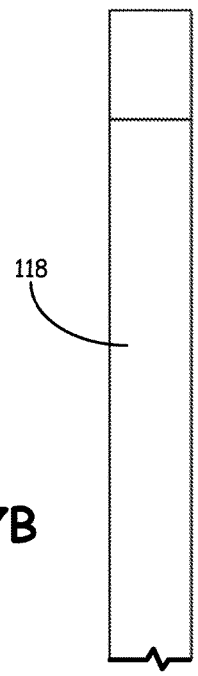
Figure 27D:
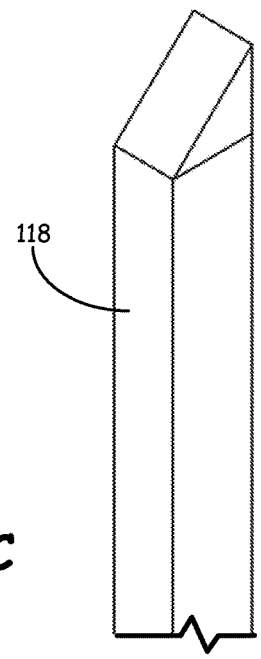
Figure 28A:
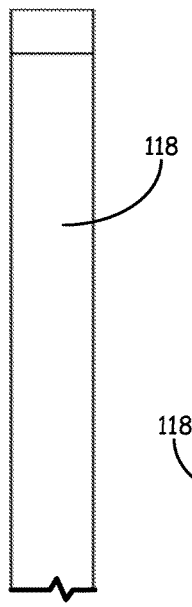
FIGS. 28A-D are partial views of a double chisel with rounded trough style pin tip in side, front, other side plan view, and a perspective view.
Figure 28B:
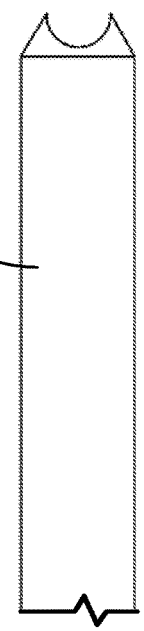
Figure 28C:
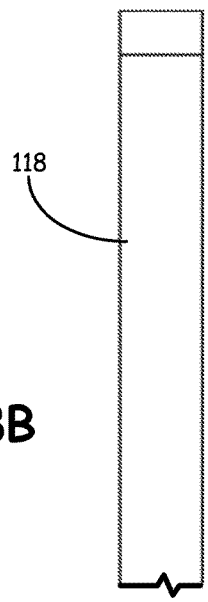
Figure 28D:
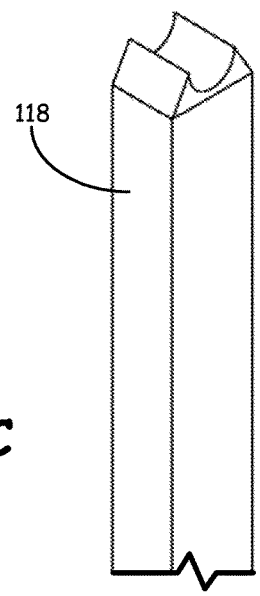
Figure 30A:
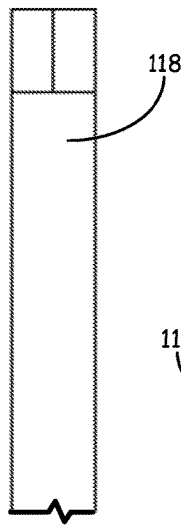
FIGS. 30A-D are partial views of a slot style pin tip in side, front, other side plan view, and a perspective view.
Figure 30B:
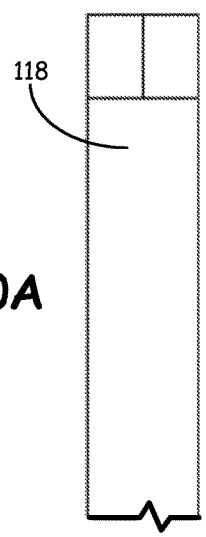
Figure 30C:
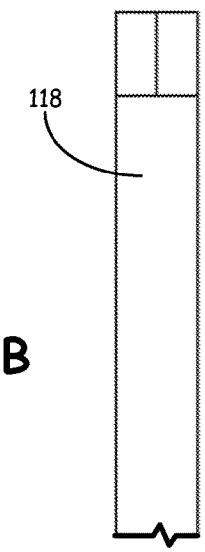
Figure 30D:
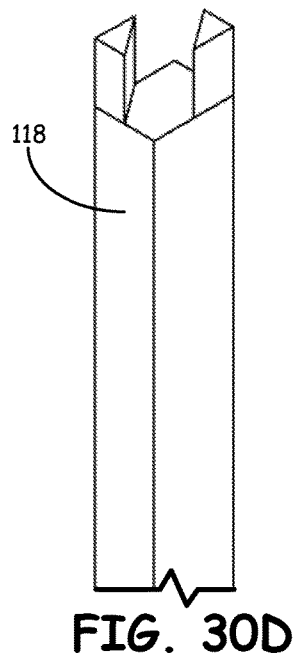

A further pin embodiment 118d is shown in FIGS. 24A-B. It has a longitudinal recess to receive a conductor (not shown) which will fill the recess. This conductor insert (typically copper) provides lower resistance than the remaining pin material.

In this embodiment, there is one crowned tip 240a and a roof-peak tip 240b adjacent thereto. This may also be used for Kelvin environments.

FIGS. 25-30 are provided to illustrate alternative geometries.

FIGS. 25A-D illustrate a rooftop shape with a centerline and two sloping sides.

FIGS. 26A-D illustrate an inversion of FIG. 25 with a trough in place of a peak and then two spaced part peaks with walls sloping to the trough and vertical outerwalls.

FIGS. 27A-D illustrate a single slope from one side to the other with a side ridge.

FIGS. 28A-D illustrate arcuate outer walls converging into a peak and then receding into an arcuate trough.

FIGS. 29A-D illustrate an arcuate dome.

FIGS. 30A-D illustrate a pair of triangular wedges with a flat trough in between. Other tip geometries are also possible.

Figure 31:
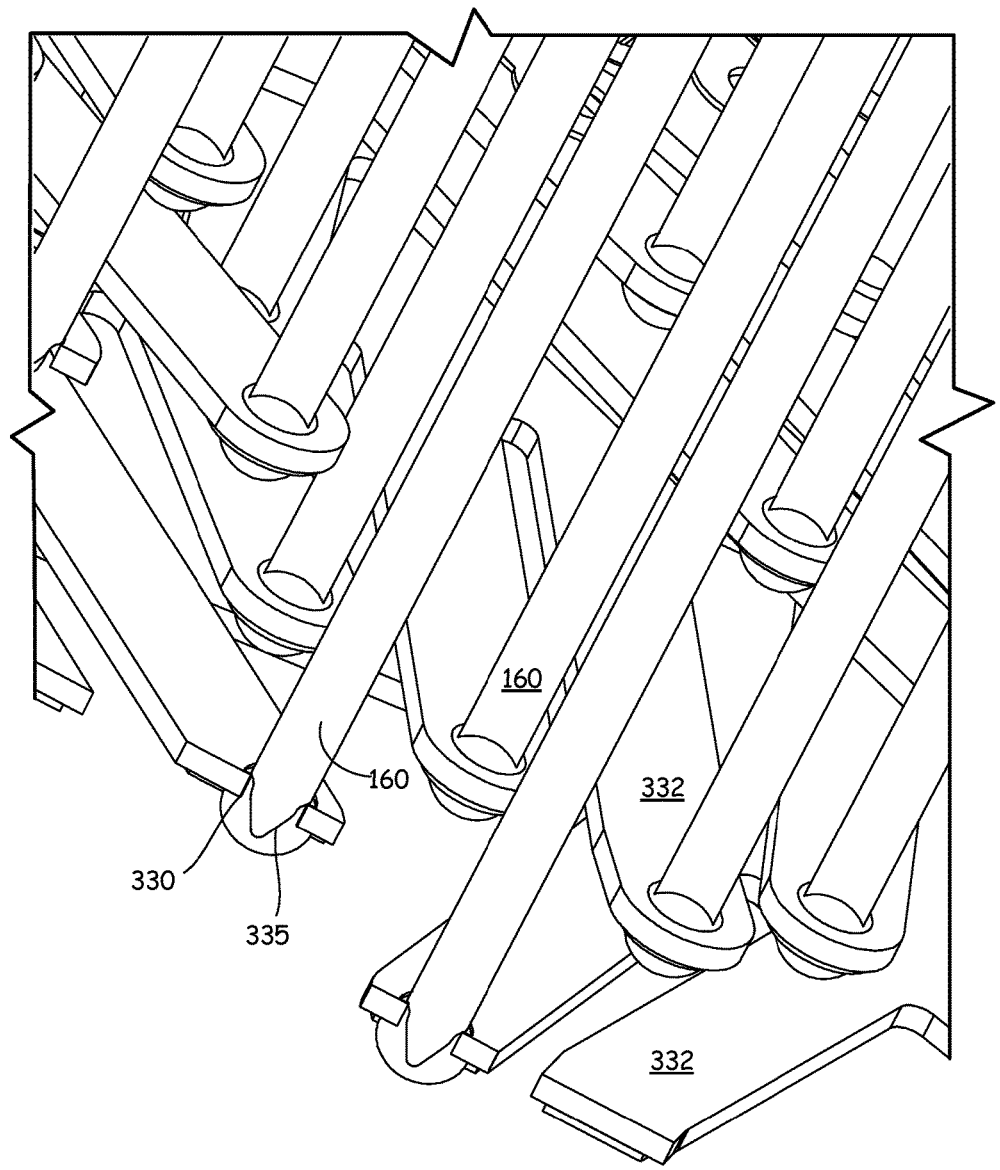
FIG. 31 is a close up partial perspective view of the connection between pins and flex circuit connection points.

FIG. 31 shows the interconnection of the pin bottom ends 160 are shown connected to flex trace fingers 322 having apertures 330. In the preferred embodiment the ends 160 are soldered 335 or conductively glued to the apertures.

Unlike the prior embodiment where the pins were of predetermined length and position, this embodiment contemplates pin locations and lengths that can vary according to need. Thus the rectilinear array shown in FIG. 5 with the longest pins in the central region, may not occur.

Figure 32A:
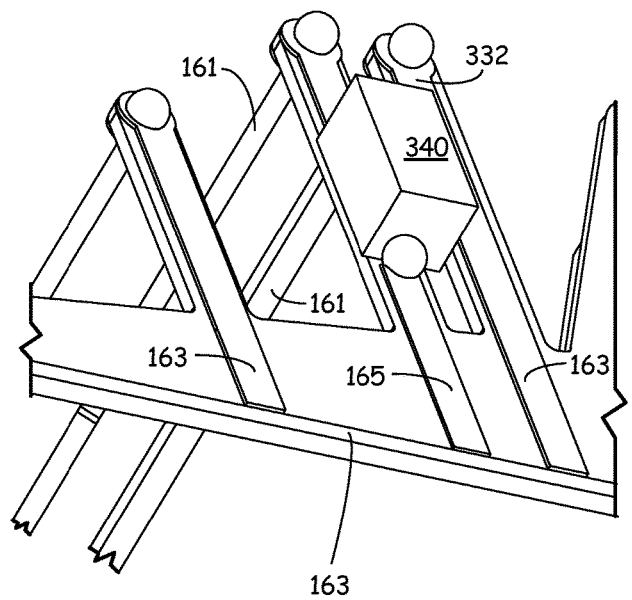
FIG. 32A is a close up partial perspective view of an in-circuit device in a flex circuit.
Figure 32B:
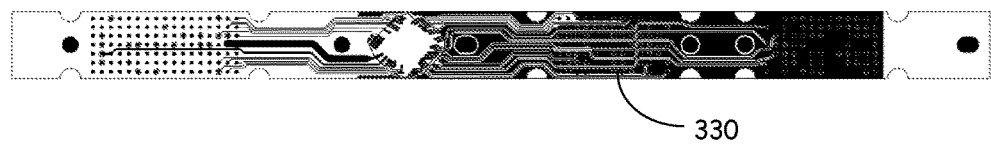
FIG. 32B is a single flex circuit layer and FIG. 33 is a close up perspective if of a flex circuit with coaxial shield.
Figure 33:
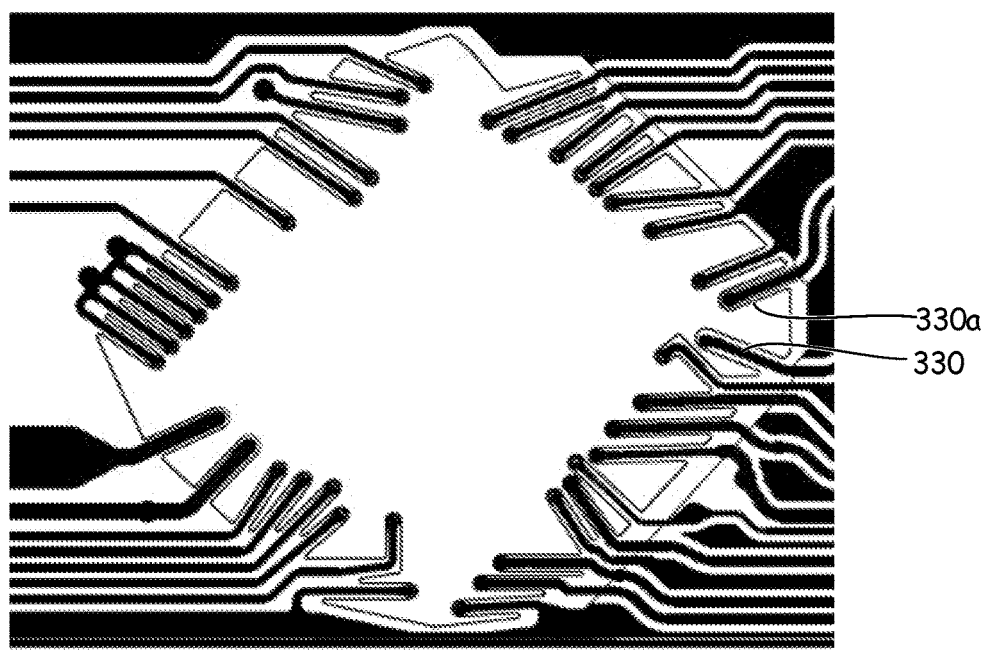
Figure 34:
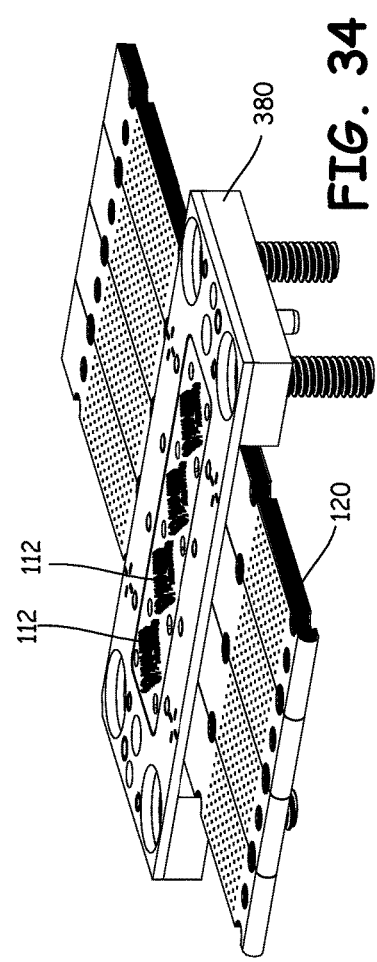
FIG. 34 is an exploded perspective view of the top portion of an array of test housings and flex circuits.
Figure 35:
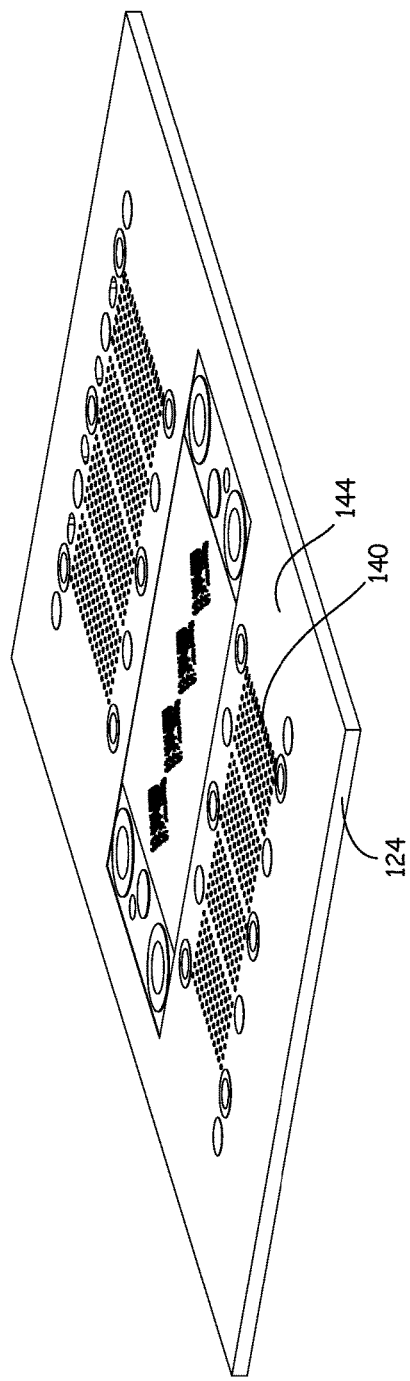
FIG. 35 is an exploded perspective view of the bottom portion of an array of test housings and flex circuits.
Figure 36:
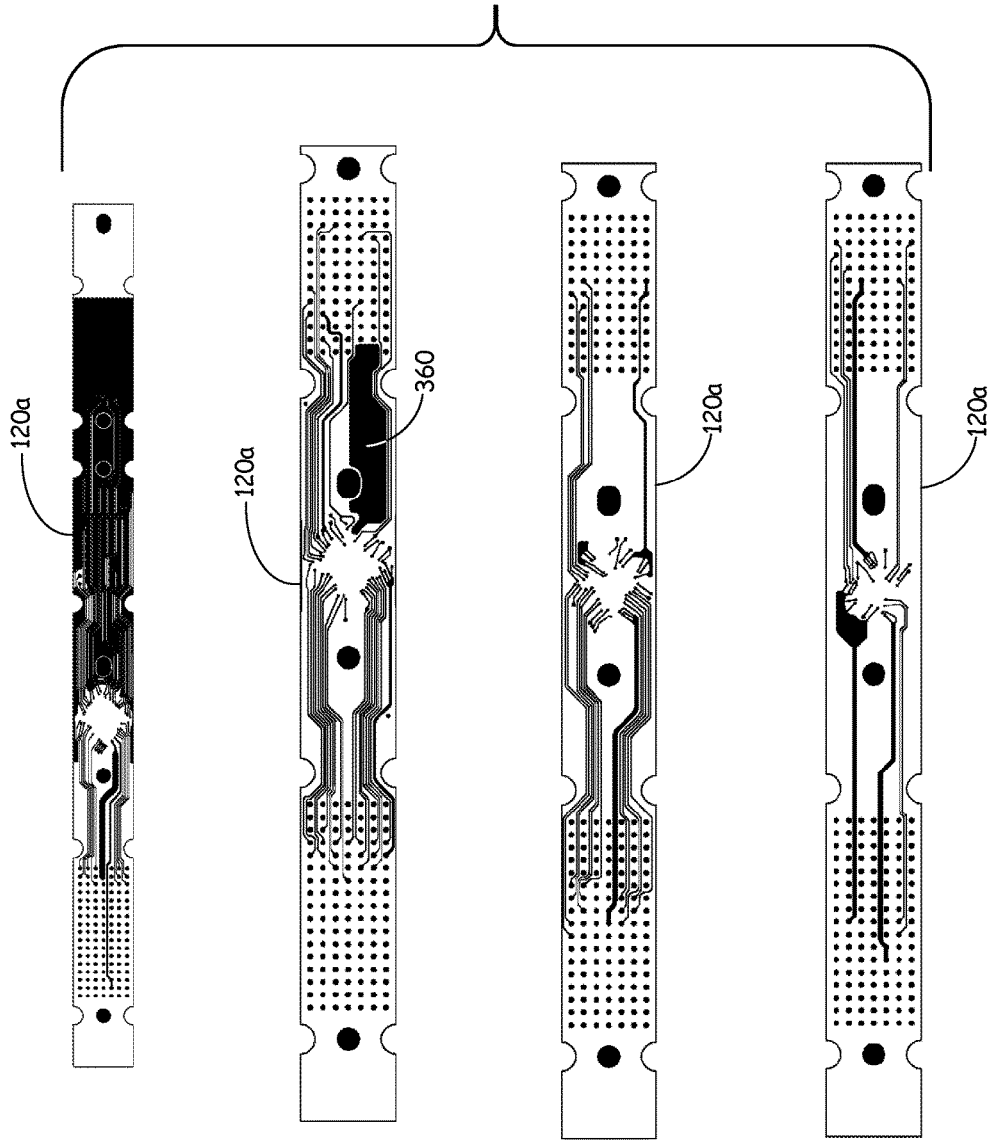
FIG. 36 is a top plan view of several layers of flex circuits.

To accommodate this, a finger pattern structure as shown in FIGS. 33, 34 and 35 is provided which show exemplary seven layers of flex circuits configured to each end of each pin and to provide, as needed, coaxial ground plane regions to maintain required impedances. These fingers are arranged to reach appropriate pins regardless of pin location. FIG. 34 shows that multiple flex circuit layers can be applied atop each other and by "reaching" the fingers to the required locations, it is not necessary for certain pin to be joined only to designated flex layers as shown in FIG. 5. This also permits the use of ground plane fingers (i.e. fingers connected to ground) to surround certain pin contact points and other fingers to maintain desired impedances, such as illustrated in FIG. 32B. In FIG. 32B pins 160 are coaxially surrounded by ground plane finger 330b which make not contact but provide impedance.

Likewise, for certain signals it may be necessary to amplify or otherwise condition the signals into or out of the pins. As shown in FIG. 32A, in-line active devices 340 can be put in series with the traces to condition the signal. Also shown in FIG. 32A is how ground shielding can be accomplished by specific placement of ground traces 163 on either sides of a signal trace 165. By adjustment of the spacing between the ground and signal traces, a coaxial shield can be created, which is especially valuable for high frequency signals.

Figure 37:
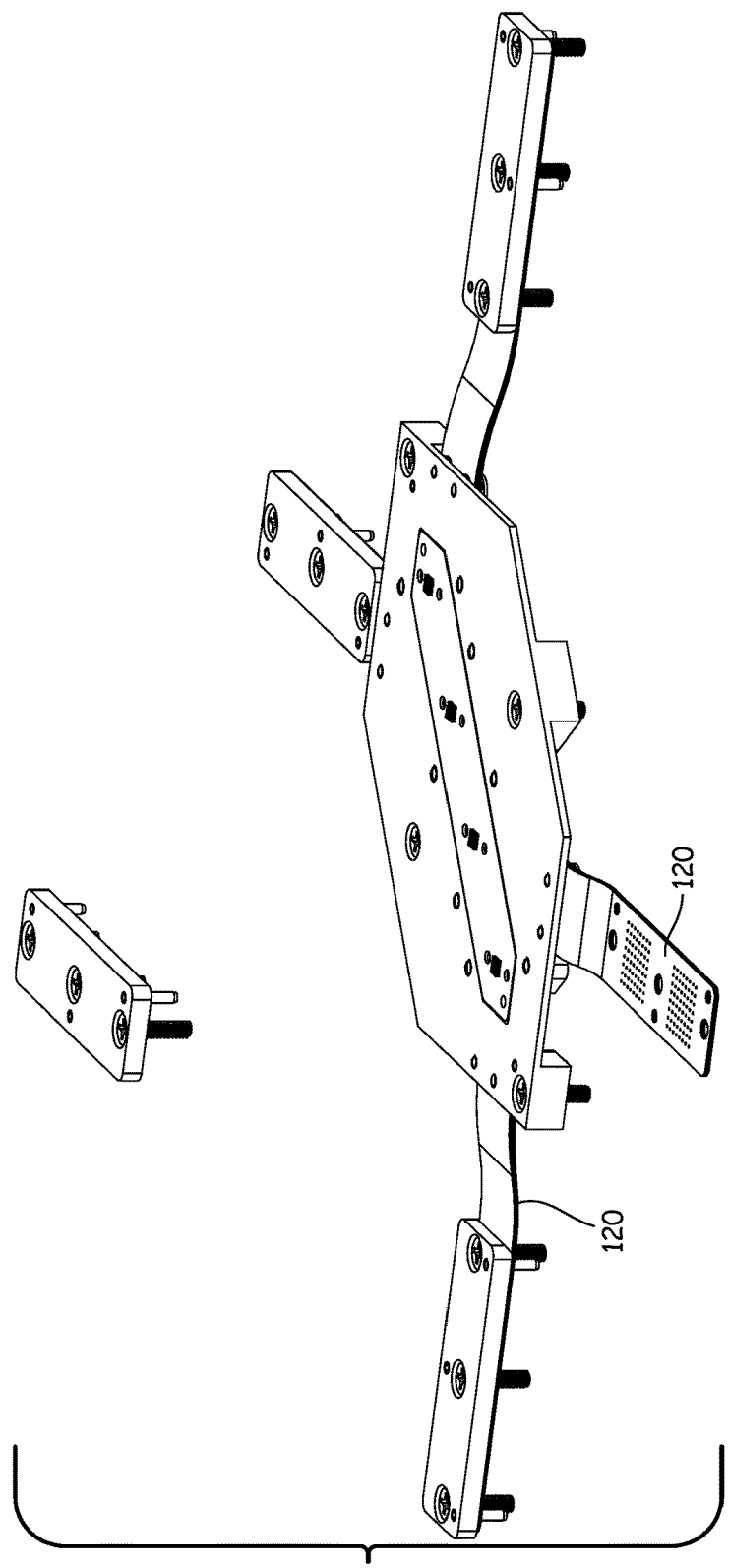
FIG. 37 is a top perspective view of one type of housing array.
Figure 38:
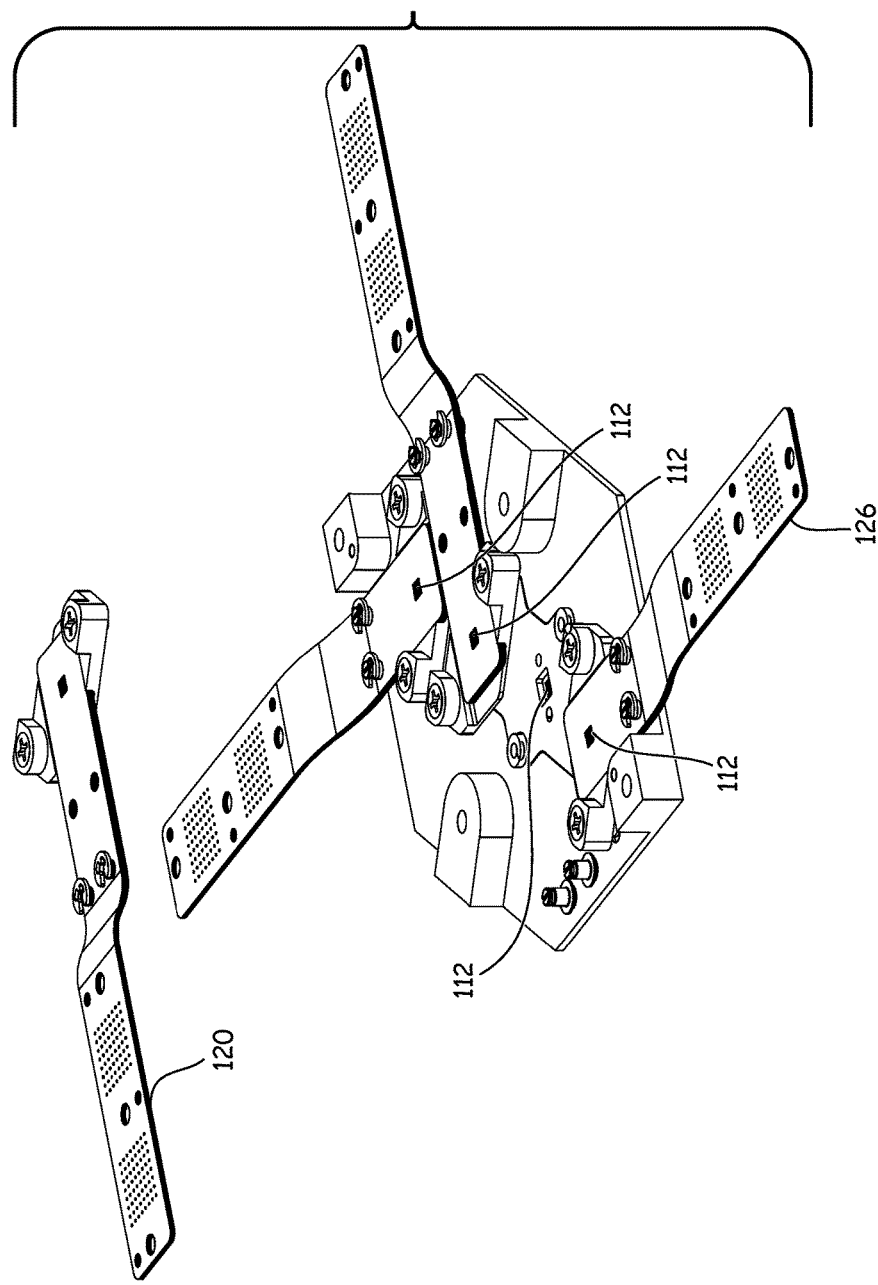
FIG. 38 is a view like FIG. 37 with portion exploded away.

FIG. 37 illustrates four of the seven layers of flex circuits shown 120a in FIG. 35. Region 360, show a ground shield area which surrounds a pin connection and thereby maintains the required/desired impedance.

FIG. 36 illustrates a side by side parallel assembly flex circuit stacks 120. A plurality of parallel stacks of flex circuits 120 carried signals to and from the pins array groupings 112 as will be explained herein. Underneath the flex circuit stacks 120 is an optional conductive bump interposer board 124 which includes an array of conductive vias 140 on a via plate 144 which carry signals from the flex circuits to the load board. The bump plate is a non-conductor with a plurality of conductive vias as shown in FIGS. 36 and 41b aligned with like contacts on the flex circuits and load board. A temporary shipping plate 150 is shown but a load board of known art would be substituted in its place.

The plurality of side by side flex stack 120 are compressed by bracket 380 which maintains the stacks, pins and (optional) bump plate in contact with the load board. By this side by side relationship, it is possible to remove a single pin array and flex circuit stack as a replaceable cartridge from the adjacent arrays 112 so that quick and simple replacement can be effected. FIG. 42 illustrated one stack removed by removal of the c-clips 382 from studs 384.

Figure 39:
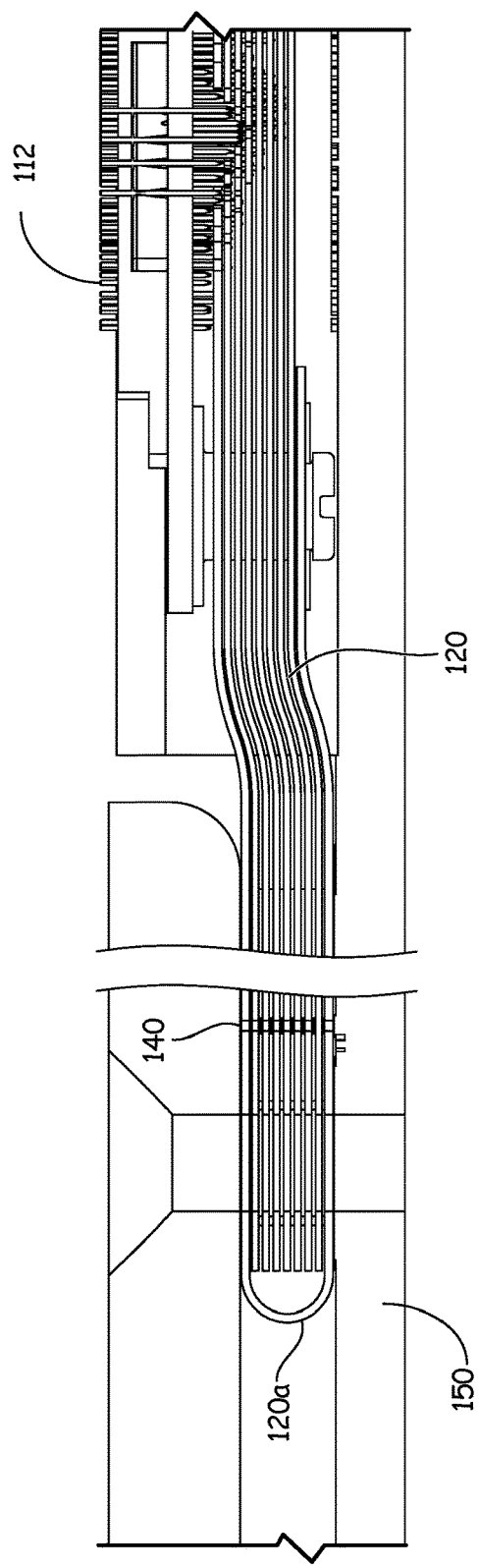
FIG. 39 is a side plan view with portion of the housing and stacked flex circuits with the top layer folded away from the stack to avoid changes in impedance causes by adjacent layers.

FIG. 39 illustrates an alternate embodiment when the flex stacks 120 are oriented in different directions to each other typically two stacks are orthogonally oriented relative to their adjacent stack. This permits dispersion of the contacts points along a greater portion of the load board so that the real estate on the load board is not as concentrated. In this configuration, any of the stacks can be removed without removal of adjacent stacks for similarly easy replacement.

FIG. 39 is a side sectional view of an array stack 120 and pin array 112. In this figure, the top flex layer 120a is wrapped under all of the other layers so that it is closest to the load board 150. This brings the top layer directly to the load board and avoids the need for a pass through via 140, such as shown in FIG. 41. Such a via connection, passing adjacent other flex circuits may create unacceptable impedances. This is especially true for high frequency test points. It will be appreciated that additional flex layers may be looped under the bottom layer, but this will quickly create the problem which was to be avoided if too many are looped.

Alternatively, in FIG. 40B, top layer 120a is extended laterally beyond the stack 120 to provide another way to make direct connection to the load board. The methodologies of FIGS. 39-40 can be used together so long as the lateral extension of 40 is used for the layer above the tuck under layer(s).

Figure 43B:
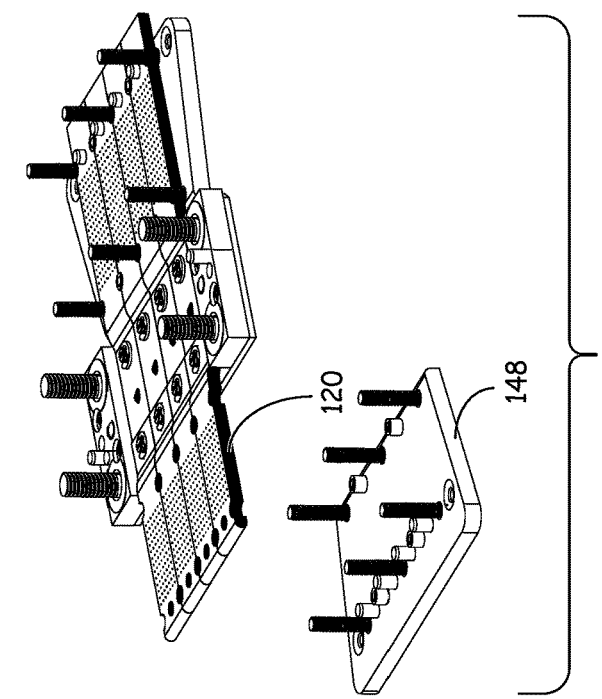
FIGS. 43A and 43B are top and bottom perspective views of a clamp plate applied to the housing.
Figure 43A:
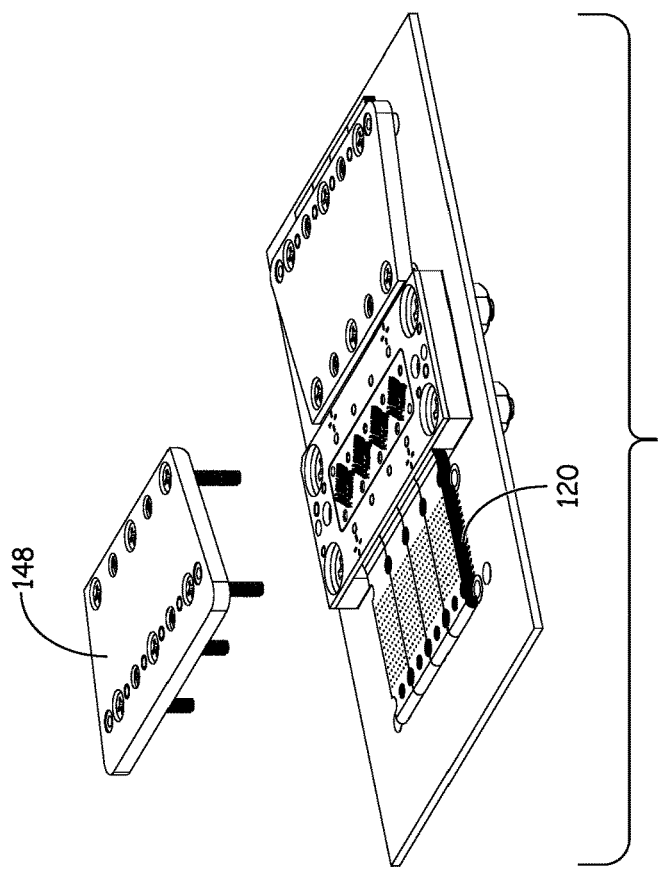

FIGS. 43A-B are top and bottom perspective views of the compression plate 148 (also shown in FIG. 12) which compress the flex circuit stacks against the load board.

Figure 44:
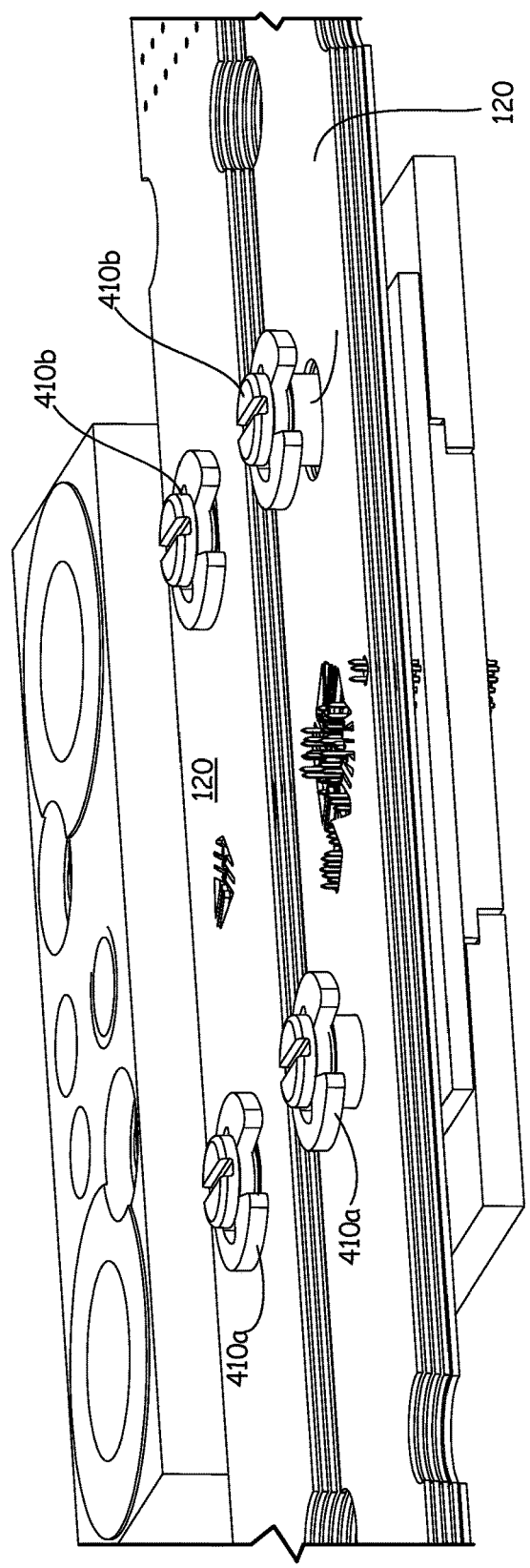
FIG. 44 is a side perspective view of a retainer system for strain relieve and for allowing lateral movement.

FIG. 44 is a view of a retainer system for holding stacks 120 in alignment. Studs 410a pass through round holes in the flex circuit stacks 120. Holes 410b pass through oblong holes 412 which allow for the flex stacks to be clamped but remove any strain which may accumulate between the holes by allowing for some degree of X-axis movement to allow for tolerances.

Figure 12:
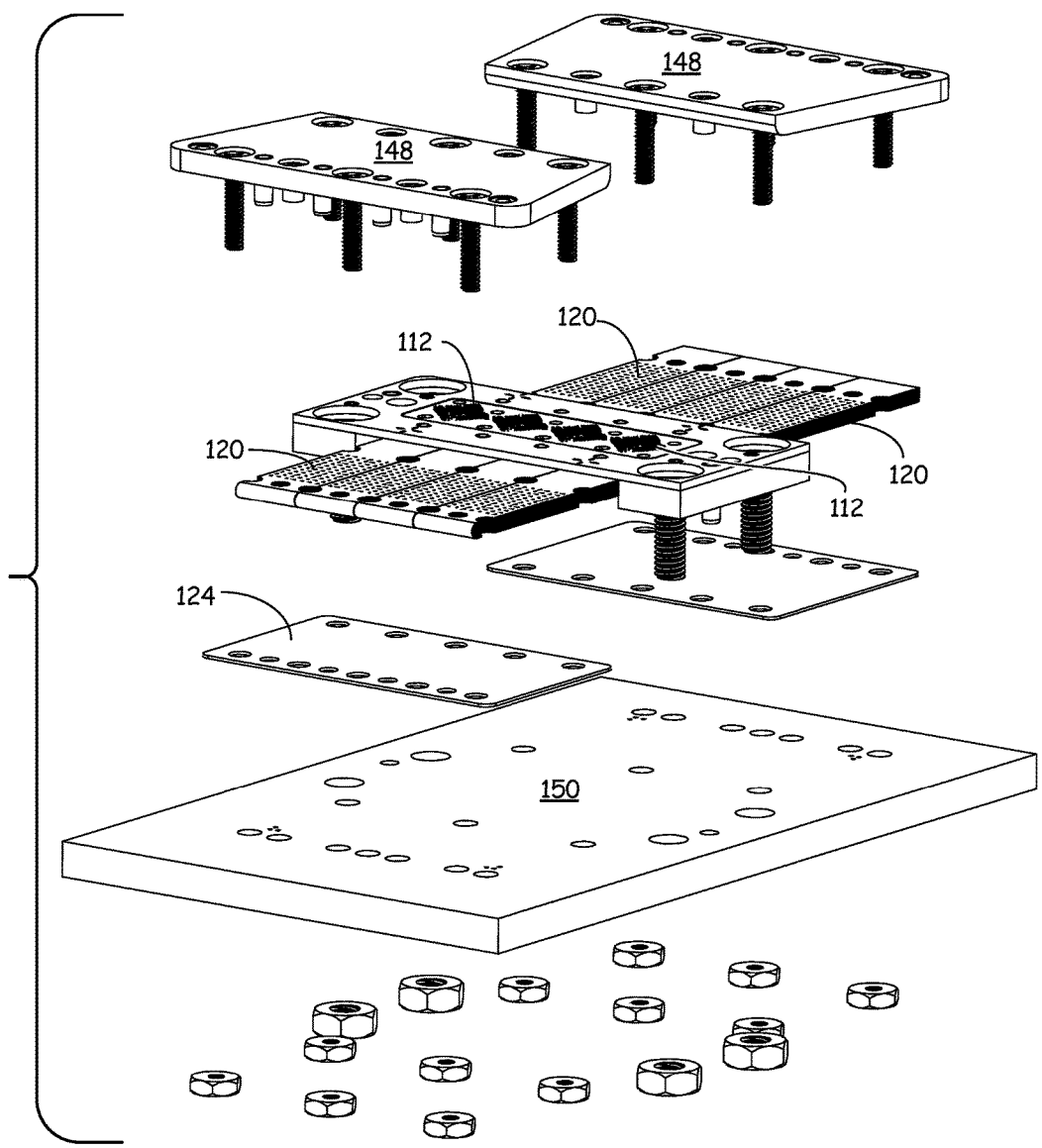
FIG. 12 is an exploded perspective view of a second embodiment.
Figure 45:
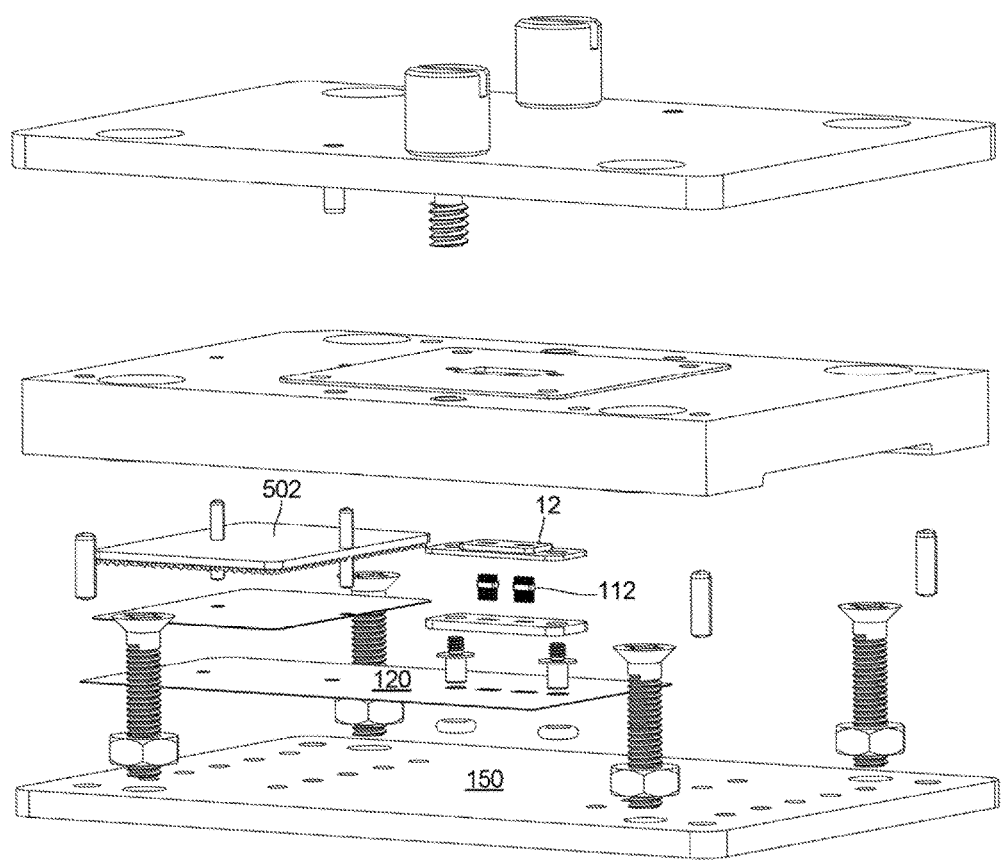
FIG. 45 is an exploded perspective view like FIG. 12 showing an alternate embodiment.
Figure 46:
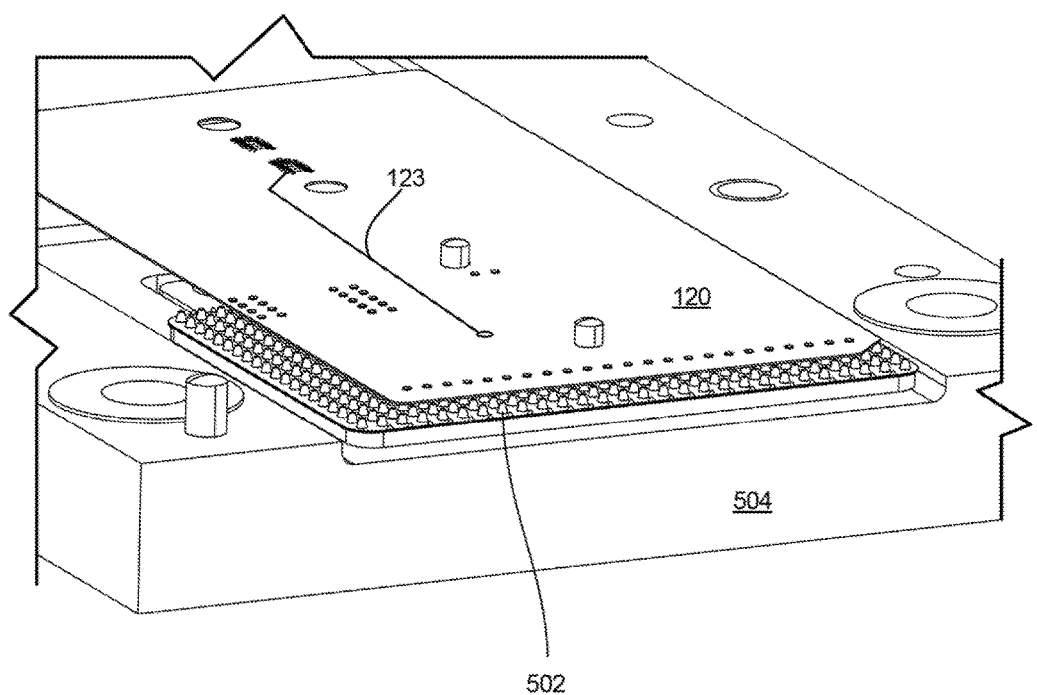
FIG. 46 is a perspective view of portions broken away of a conical elastomer to bias a flex circuit ribbon into contact with a load board.
Figure 48:
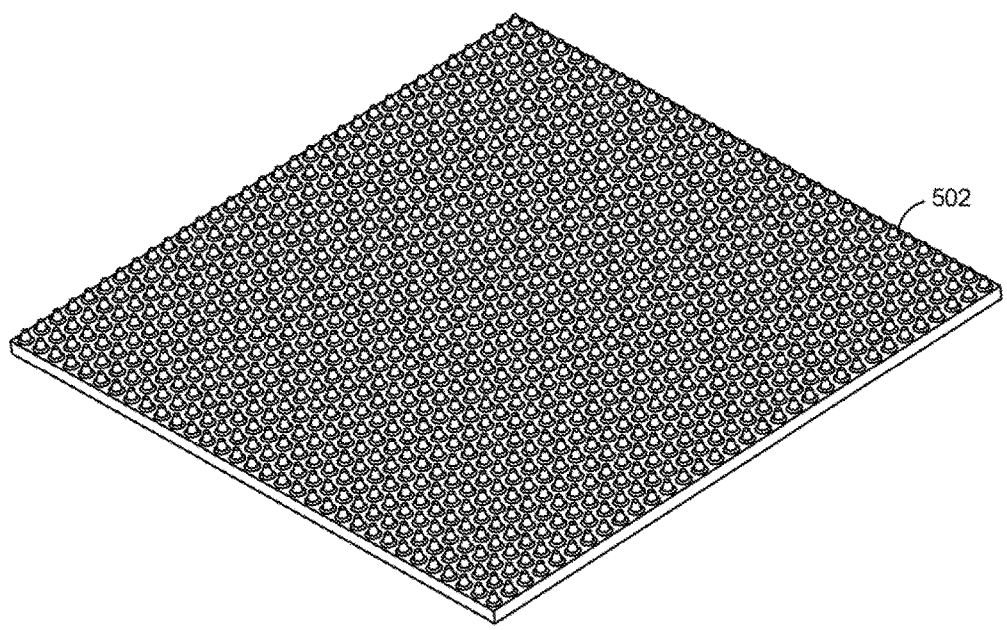
FIG. 48 is a top perspective view of a sheet of conical elastomer.

FIG. 45 illustrates an alternate embodiment with a conical elastomer array 502 (see also FIG. 48) which replaces the bump interposer board 124 from FIG. 12. The flex circuit 120 (FIG. 46) shows a trace 123 which runs from array of test pins 118 laterally to a reach an appropriate location on the load board (not shown). The conical elastomer provides a focused bias force against the flex circuit and consequently the load board so that contact on the flex circuit make solid electrical contact the load board. A retainer or clamping plate 504 applies pressure to keep the sandwich of layers in close electrical and physical contact.

Figure 47:
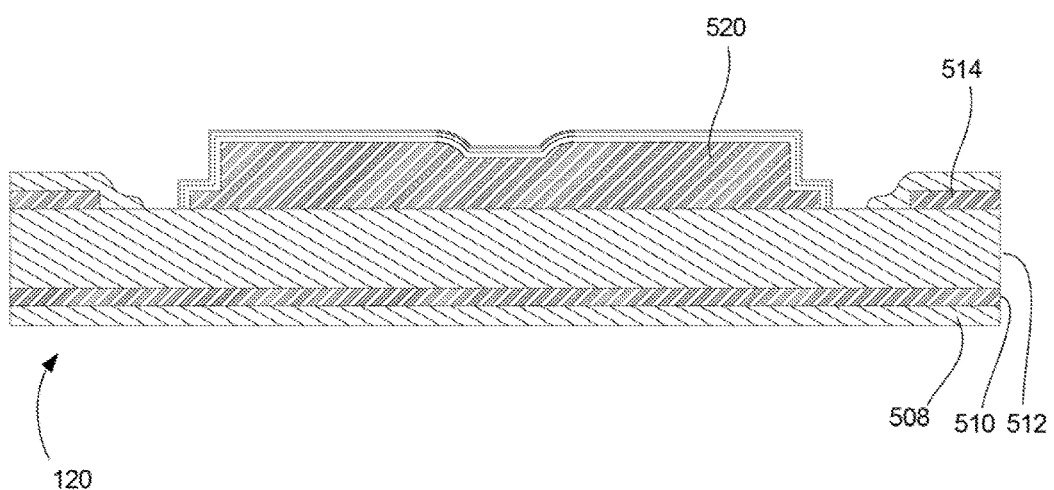
FIG. 47 is a side cross sectional view of a portion of a flex circuit with contact bumps.
Figure 49:
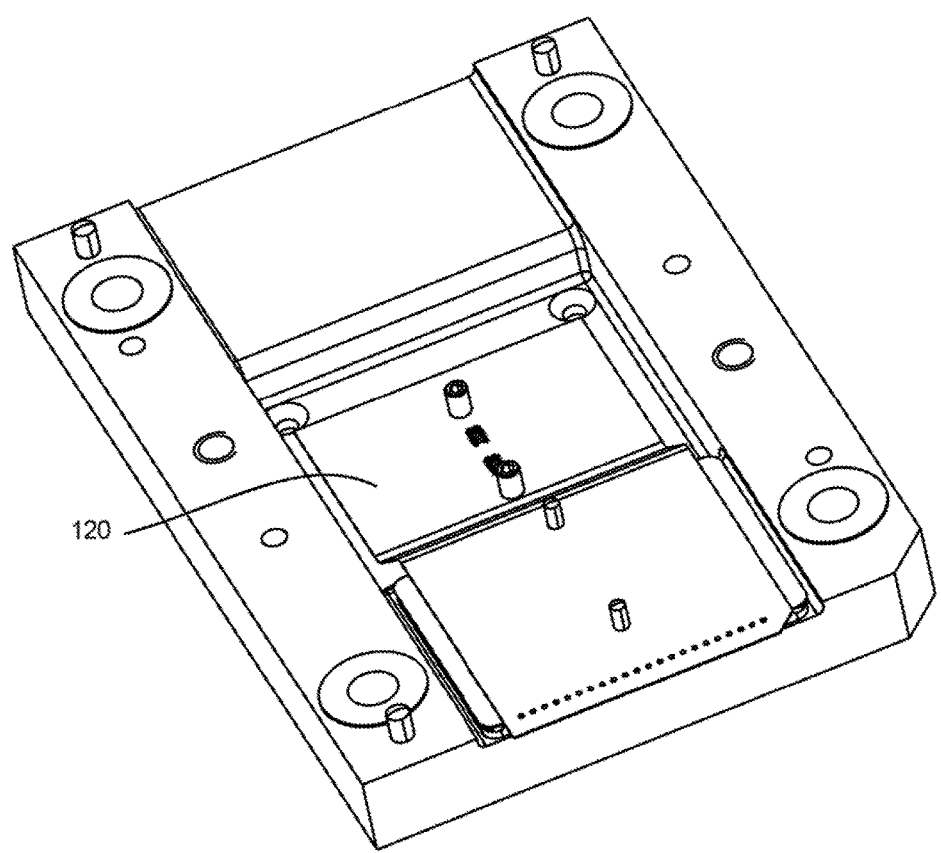
FIG. 49 is a photographic view of a flex circuit ribbon from a pin array to a load board (not shown).

FIG. 47 illustrates a cross sectional view of flex circuit 120 with A Kapton® layer 508, a copper layer 510, a thicker Kapton® or polyamide layer 512 and a further copper layer 514. A bump pad 520 is preferably nickel with gold plate for maximum conductivity when engaging the load board. FIG. 49 illustrates how the flex circuit bends to shift longitudinally from the plane of the bottom of the pin array to the load board plane so that the load board may be in a different plane (non-coplanar) but preferably in parallel spaced apart planes).

Figure 50:
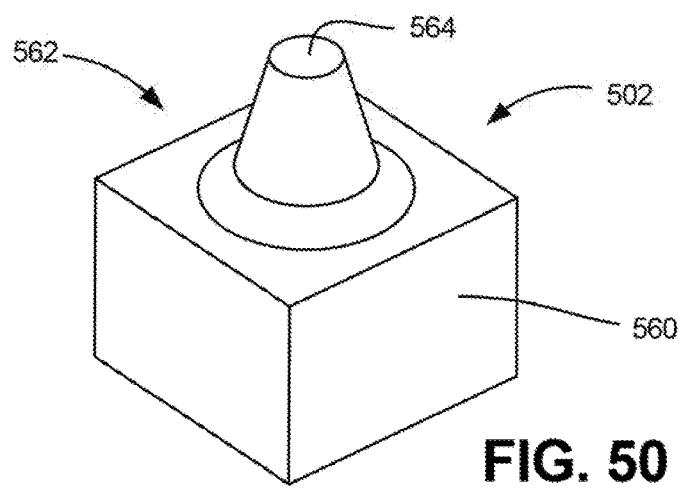
FIG. 50 is top perspective view of a single conical elastomeric element.
Figure 51:
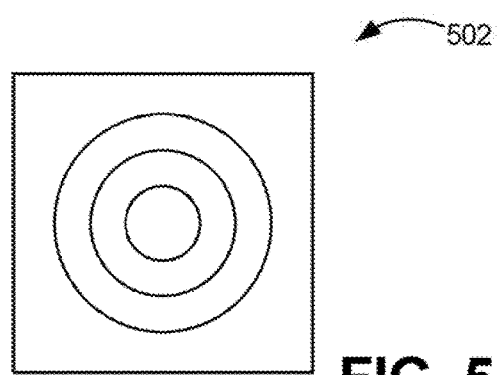
FIG. 51 is a top plan view of FIG. 50.
Figure 52:
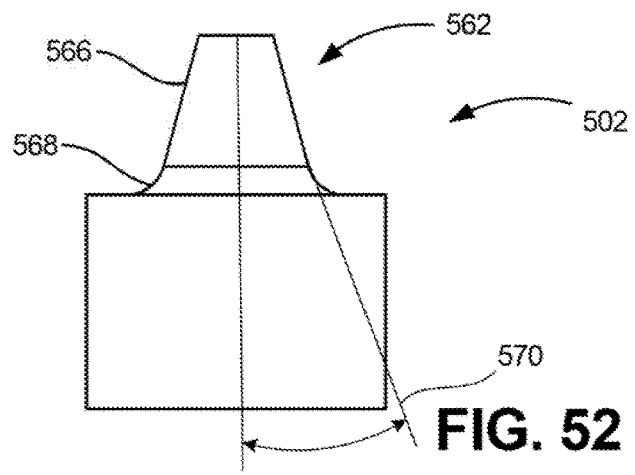
FIG. 52 is a slide plan view of FIG. 50.
Figure 53:
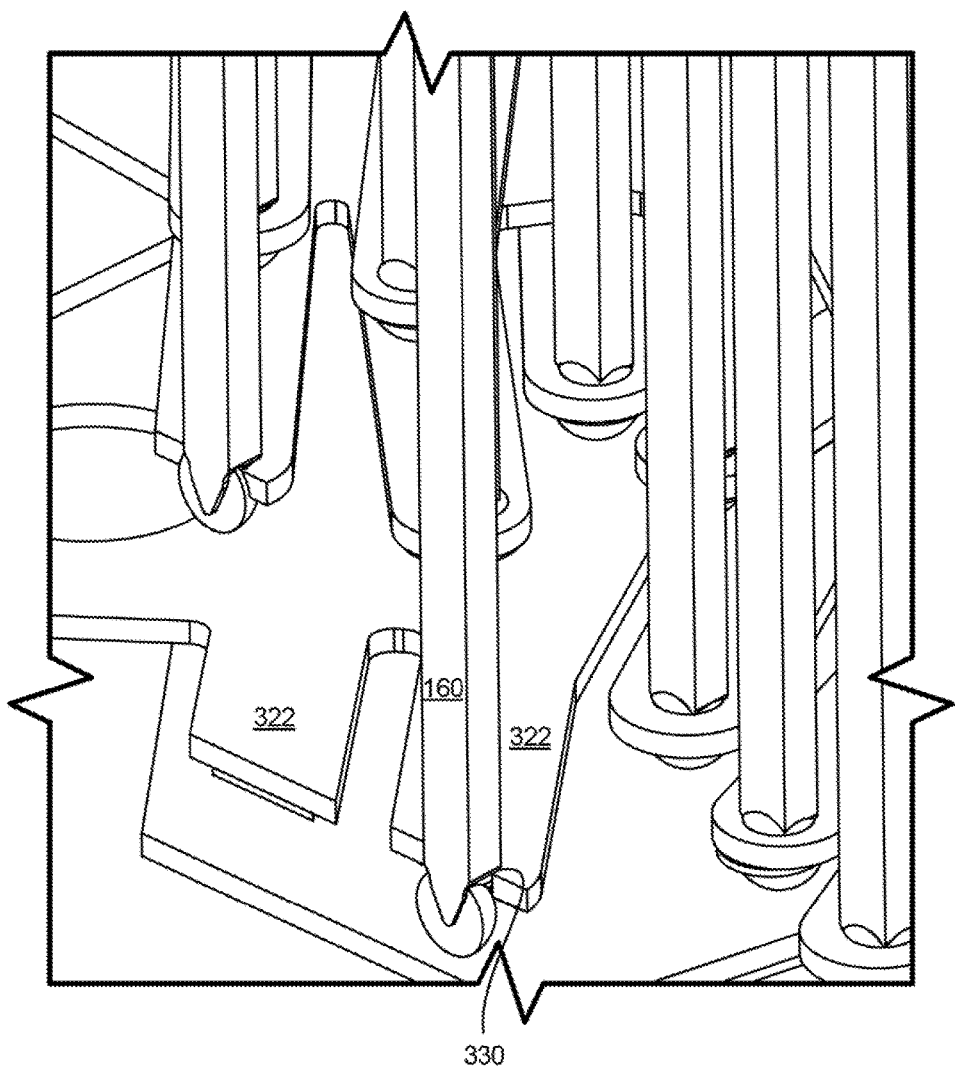
FIG. 53 is a close up perspective view of FIG. 31 according to further embodiment.
Figure 54:
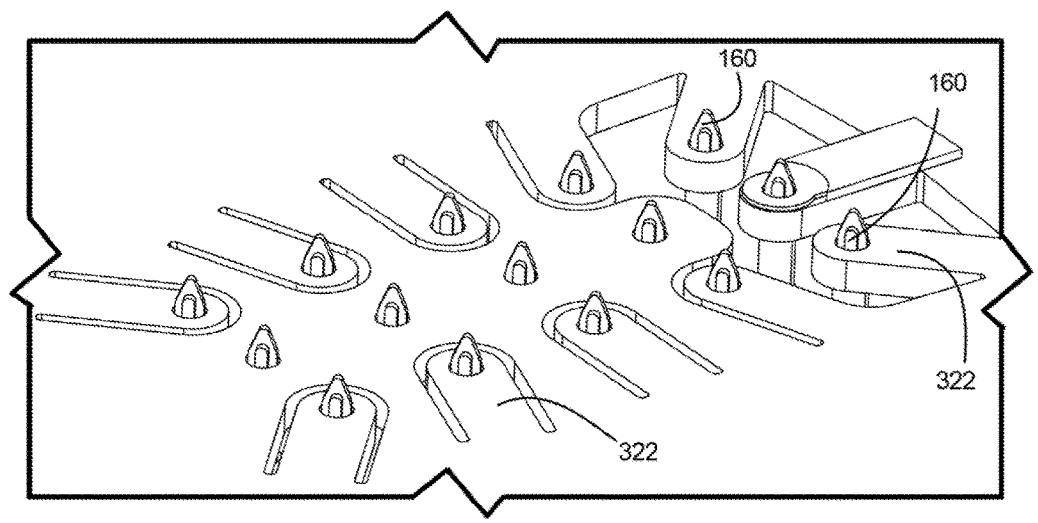
FIG. 54 is a bottom perspective view of the subject matter of FIG. 53 with portions removed.
Figure 55:
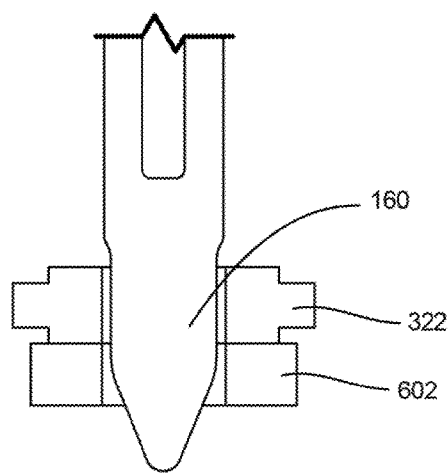
FIG. 55 is a side plan view with portions broken away showing a pin and alternate embodiment donut joint.
Figure 56:
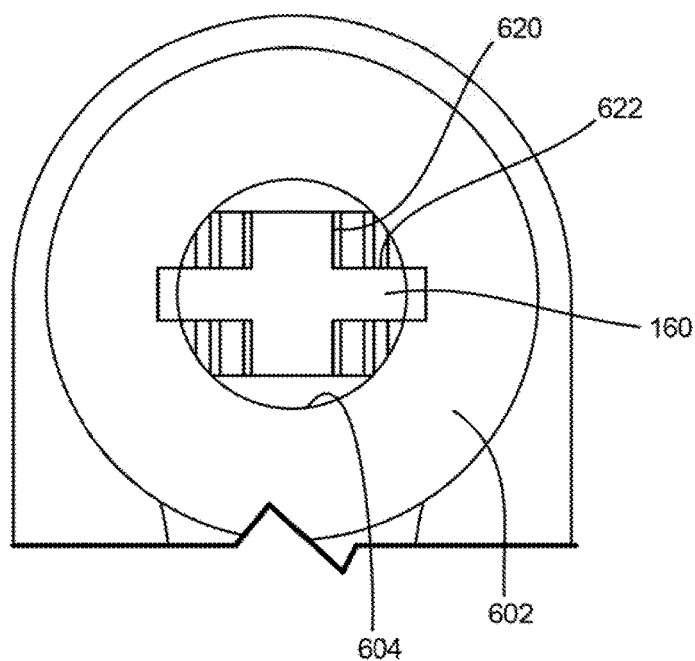
FIG. 56 is a bottom plan view of FIG. 55.
Figure 57:
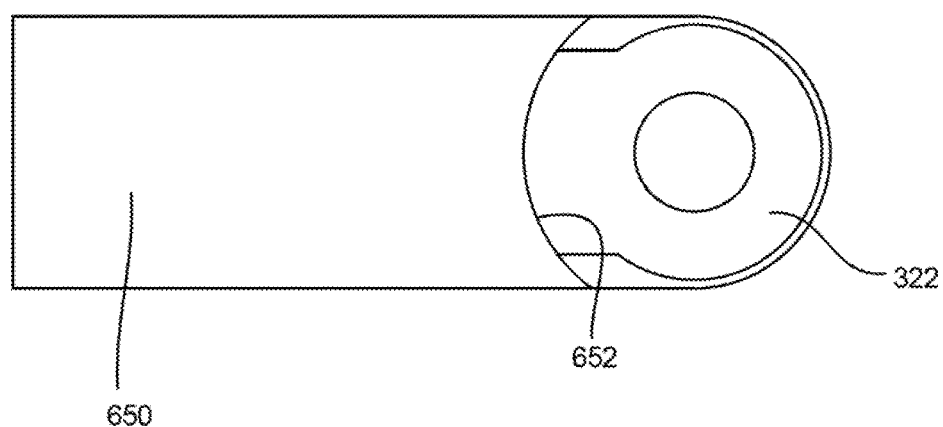
FIG. 57 is a close up plan view a flex circuit trace with a receiving hole for a pin and a solder dam.

FIGS. 50, 51, and 52 illustrate a preferred embodiment for a conical elastomeric bias element or compression pad. The basic function is to provide a bias force against the flex circuit (or other contact array from the test pins) to the contact surfaces on the load board. The flex circuit many contain hundreds of electrical contact points at regular or random locations on its surface so it is important to provide as many bias points as possible which align generally with the contact points. By providing a high density (high resistance to compression) matrix of spaced apart cones, with spacing between the centers of the cones being preferably equal to or less than the average or mean spacing of contact points on the flex circuit or load board, there is a high likelihood that at least one cone will be located in line with at least part of a contact point, therefore providing the desired bias force. A flat elastomeric sheet is possible but providing a plurality of individual elastomeric bias points provides greater force per unit area so the cones will provide greater force on the contact points. In FIGS. 50-52, an individual contact point is shown apart from the sheet as a whole. It has a base substrate layer 560, a conical section 562, and a tip 564, which is preferably planar. As shown in FIG. 52, the conical section 562 may be formed as a base segment 568 and a steeper conical segment 566. The material used may be of uniform resilience or the conical section and indeed the two conical segments may be formed with different resilience by casting the sheet in different layers with different materials. For example, the base substrate layer 560 may have a higher/lower resistance to deformation than the layers in the conical section. The conical angle 570 may also be varied to alter the resistance to deformation. A planar tip may also be substituted with a pointed tip. The conical elastomers may be formed in a mold with or without layers of different stiffness, the stiffer layer being toward the conical portion. The conical shape is tapered from top to base providing a simpler way to remove the very small cones from a mold. Further, by using independent projecting elements, such as cones, the bias force has an independent suspension effect from cone to cone focusing most of the force into the load board, whereas a planar sheet would transmit forces laterally potentially affecting other contact points. The cones may be hollow, solid or partially hollow, depending on the resistance to compression desired.

FIGS. 53-57 provide an alternative structure and method for connecting pins to flex circuits. Pin ends 160 protrude through aperture 330 in the flex circuits trace fingers 322. In prior embodiments, solder balls were used to join the pin ends to the fingers. In this embodiment, preformed conductive donut shaped rings 602 (see FIGS. 55-56) are provided.

Conductive donut rings 602 have an aperture 604 sized to mate with the aperture in the flex circuit. It is possible and perhaps desirable, to make the aperture 604 smaller than the flex circuit aperture so that more of the pin tip 160 will engage the ring. The conductive ring may be a solder paste or other conductive material. It may be flowable solder which liquefies in response to heat to make a solid electrical bond between the tip and flex circuit. The tip 160 may be enhanced as shown with vertical and horizontal cross members 620, 622 to increase the contact surface area with the flex circuit and the conductive material. The tip may also be conical so that its narrow end can be more easily threaded into the flex circuit aperture.

If the conductive material is flowable, then it will flow along the flex circuit 322. It is desirable to limit the flow of such conductive material because its presence can change the impedance of the flex circuit which may interfere with high frequency response. To minimize this effect, a barrier 650 is applied to the flex circuit 322 which stops the flow of any solder or other conductive joint material at the barrier wall 652. The preferred barrier is a non-conductive polyamide/plastic coating which bonds to the conductive flex circuit material so that solder cannot flow underneath it. The preferred wall shape is arcuate as shown so that the flow will be shunted back to the flex terminal and spread out along the curved wall, thereby minimizing solder build up. A concave wall is shown, a convex or other shape is also possible.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A test system for testing integrated circuits (IC) comprising:
   a. an upper probe guide plate having an array of spaced apart upper apertures for receiving a test probe;
   b. an anti-intrusion layer proximate said upper probe guide plate, said layer having a like array of spaced apart lower apertures, collinearly aligned with the apertures of said upper guide, or receiving a test probe;
   c. an elastomeric block have a like a like array of spaced apart apertures, collinearly aligned with the passages of said upper guide, for receiving a test probe;
   d. a plurality of elongated test probes having a probe tip at its distal end and a connecting end at its proximal end, and a cross member extending generally orthogonally from each of said probes, said cross member being of such extent that it cannot pass through said upper apertures or said passages in said elastomeric material;
   e. said test probes passing through said upper and lower apertures and said passages, with said cross member located between said upper probe guide plate and said anti-intrusion later, so that the bias force of the elastomer drives said probes upwardly thorough said upper plate to a stop where said cross member engages said upper plate;
   f. said proximal ends of said test probes being group into a plurality of subgroups, each of the ends in said subgroup having the same height as measured from the lower probe guide relative to cross member and wherein the proximal ends in each of the subgroups having different heights relative to other subgroups;
   g. a plurality of layers flex circuits having a plurality of connection points for receiving engaging the proximal ends of said test probes, said flex circuits being laterally spaced apart in planes:
   h. a first set of said circuits having arms each with an aperture for receiving proximal ends of a test probe;
   i. a solid conductive flowable element located on at least some of said arms and having an aperture, the element aperture being concentric with the aperture of said arm, so that a portion of the proximal ends of said test probes can protrude through said apertures.

2. The system of claim 1 wherein said flowable element is a donut shaped ring sized to surround said arm aperture, said element include flowable metal capable of flowing onto said proximal end of said test probe thereby making an electrical connection between said test probe and arm.

3. The system of claim 2 wherein said flowable element includes a flowable solder paste formed into a ring structure.

4. The system of claim 3 wherein said flowable element includes materials which become liquid and flowable at a predetermined temperature above standard room temperature and solid at room temperature.

5. The system of claim 1 wherein at least some of said arms include a flow barrier portion applied spaced from said aperture, said flow barrier configured to block the flow of flowable conductive material from flowing beyond a fixed point on said arm.

6. The system of claim 5 wherein said barrier includes a non-conductive material bonded to said arm to provide a physical barrier to flowable material.

7. The system of claim 6 wherein said barrier has a distal end proximate said aperture which is concave.

8. A test system for testing integrated circuits (IC) comprising:
   a. a plurality of elongated test probes having a probe tip at its distal end and a connecting end at its proximal end,
   b. a plurality of layers flex circuits having a plurality of connection points for receiving the proximal ends of said test probes, said flex circuits being laterally spaced apart;
   c. a first set of said flex circuits having arms each with an aperture for receiving proximal ends of a test probe at one end and termination points at another end; said other end having a first face for electrical contact with a load board and second back opposite said first face;
   d. a compression pad including a plurality of adjacent conical elastomeric projections applied to said opposite face with said projections engaging said opposite face to apply bias pressure on said other end of said flex circuit to maintain resilient electrical contact between the load board and said flex circuit.

9. The test system of claim 8 wherein said conical projections include a matrix of protections extending from a planar base mat, and wherein each cone has a top.

10. The system of claim 8 wherein said conical projections include a plurality of closely spaced tapered projections.

11. The test system of claim 10 wherein said flex circuits extend laterally so that said electrical engagement with said probes is laterally offset from electrical engagement with the load board.

12. A test system for testing integrated circuits (IC) comprising:
   a. an upper probe guide plate having an array of spaced apart upper apertures for receiving a test probe;
   b. a plurality of elongated test probes having a probe tip at its distal end and a connecting end at its proximal end;
   c. said proximal ends of said test probes being group into a plurality of subgroups, each of the ends in said subgroup having different heights relative to other subgroups;
   d. a plurality of layers flex circuits generally in a first plane, having a plurality of connection points adjacent one end thereof for receiving engaging the proximal ends of said test probes, said flex circuits being laterally spaced apart in planes, and at an another end thereof, being configured to electrically engage a load board located in a second plane generally parallel but spaced from the first plane:
   e. a first set of said circuits having arms each with an aperture for receiving proximal ends of a test probe; and
   f. the proximal end of each probe having a tip which is received within the aperture of said arm, so that the tip portion of the proximal ends of said test probes can protrude through said apertures and make electrical contact therewith.

13. The test system of claim 12 further including a compression pad for biasing a portion of said flex circuits into engagement with said load board.

14. The test system of claim 12 wherein said compression pad including a plurality of adjacent conical elastomeric projections applied to a portion of said flex circuit adjacent said load board maintain resilient electrical contact between the load board and said portion of the flex circuit.

15. The test system of claim 14 wherein said conical projections include a matrix of protections extending from a planar base mat, and wherein each cone has a top.

16. The test system of claim 15 wherein said flex circuit has a plurality of electrical contact points intended to engage like contact points on the load board, and wherein the spacing between the tops of each cone is last than the average space between said contact points.

* * * * *